United States Patent
Ishikawa et al.

(10) Patent No.: US 11,875,594 B2
(45) Date of Patent: Jan. 16, 2024

(54) DETECTION DEVICE AND METHOD FOR MANUFACTURING SAME

(71) Applicant: Japan Display Inc., Tokyo (JP)

(72) Inventors: Tomokazu Ishikawa, Tokyo (JP); Masashi Shishikura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/752,979

(22) Filed: May 25, 2022

(65) Prior Publication Data

US 2022/0284728 A1   Sep. 8, 2022

Related U.S. Application Data

(63) Continuation of application No. PCT/JP2020/040722, filed on Oct. 29, 2020.

(30) Foreign Application Priority Data

Nov. 29, 2019 (JP) ................................. 2019-217379

(51) Int. Cl.
*G06V 40/13* (2022.01)

(52) U.S. Cl.
CPC ...... *G06V 40/1318* (2022.01); *G06V 40/1329* (2022.01)

(58) Field of Classification Search
CPC .......... G06V 40/1318; G06V 40/1329; G06V 40/145; G06F 3/041; G06F 3/042; H01L 27/146; H01L 31/10

See application file for complete search history.

(56) References Cited

U.S. PATENT DOCUMENTS

| 8,659,724 B2* | 2/2014 | Hagiwara ......... G02F 1/133514 345/175 |
| 2005/0041134 A1* | 2/2005 | Takayama ......... H01L 27/14627 257/E31.127 |

(Continued)

FOREIGN PATENT DOCUMENTS

| JP | H06-215993 A | 8/1994 |
| JP | H11-340446 A | 12/1999 |

(Continued)

OTHER PUBLICATIONS

International Search Report issued in International Patent Application No. PCT/JP2020/040722 dated Dec. 28, 2020 and English translation of same. 8 pages.

(Continued)

*Primary Examiner* — S M Sohel Imtiaz
(74) *Attorney, Agent, or Firm* — K&L Gates LLP

(57) ABSTRACT

A method for manufacturing a detection device, the detection device comprising a substrate, a plurality of sensor elements arranged on a first principal surface of the substrate, and an insulating film provided above the substrate so as to cover the sensor elements, and the method comprising: causing the first principal surfaces of a pair of the substrates on each of which the sensor elements, the insulating film, and a first projection projecting from a surface of the insulating film are formed to face each other, and bonding together the pair of the substrates; and polishing a second principal surface of each of the pair of the substrates on a side opposite to the first principal surface in a state where the pair of the substrates are bonded together.

9 Claims, 25 Drawing Sheets

(56) References Cited

U.S. PATENT DOCUMENTS

| | | | | |
|---|---|---|---|---|
| 2006/0170800 | A1* | 8/2006 | Hagiwara | H01L 27/14618 348/294 |
| 2010/0277627 | A1* | 11/2010 | Duparre | H04N 25/61 348/262 |
| 2010/0289939 | A1* | 11/2010 | Ogino | H01L 27/14685 257/E31.127 |
| 2012/0062478 | A1* | 3/2012 | Kim | G06F 3/045 345/173 |
| 2012/0062487 | A1* | 3/2012 | Lee | G06F 3/0443 345/173 |
| 2015/0042906 | A1* | 2/2015 | Choi | G06F 3/041 349/12 |
| 2017/0236860 | A1* | 8/2017 | Yamamoto | H01L 27/14645 257/432 |
| 2020/0160024 | A1* | 5/2020 | Jin | G06K 19/02 |

FOREIGN PATENT DOCUMENTS

| | | |
|---|---|---|
| JP | 2006-216698 A | 8/2006 |
| JP | 2010-267770 A | 11/2010 |
| JP | 2010-541197 A | 12/2010 |
| JP | 2011-065133 A | 3/2011 |
| JP | 2011-165857 A | 8/2011 |
| JP | 2012-059245 A | 2/2012 |
| JP | 2012-059245 A | 3/2012 |
| JP | 2015-035213 A | 2/2015 |
| JP | 2015-111781 A | 6/2015 |
| JP | 2015-159273 A | 9/2015 |
| JP | 2015-159275 A | 9/2015 |
| JP | 2016-213298 A | 12/2016 |
| WO | WO2005/020328 A1 | 3/2005 |
| WO | WO2015037171 A1 | 3/2015 |
| WO | WO-2015037171 A1 * | 3/2015 ............ G06F 3/044 |

OTHER PUBLICATIONS

Written Opinion issued in International Patent Application No. PCT/JP2020/040722 dated Dec. 28, 2020. 5 pages.

* cited by examiner

FIG.8
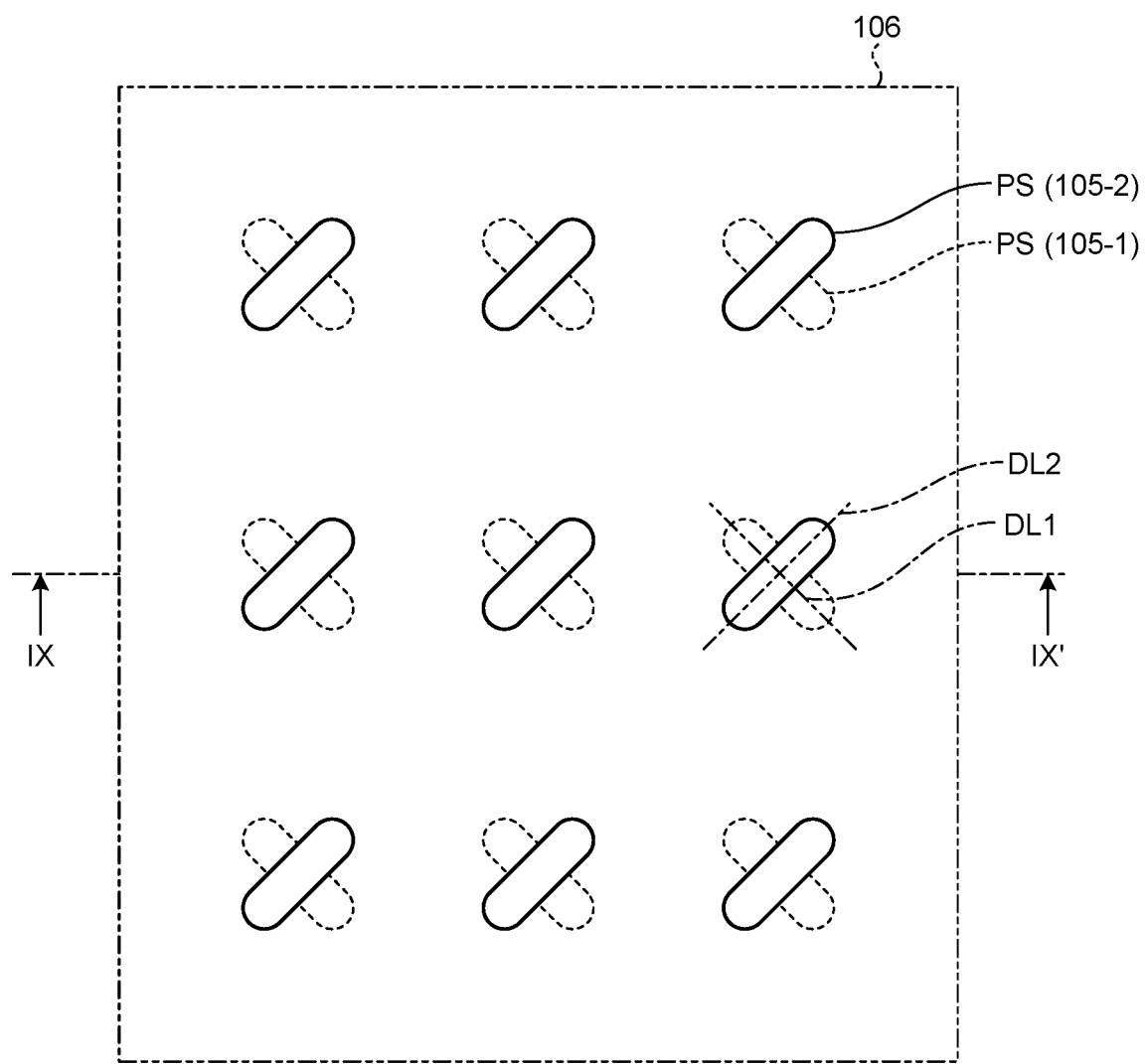
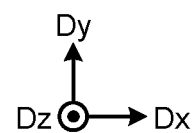

FIG.13
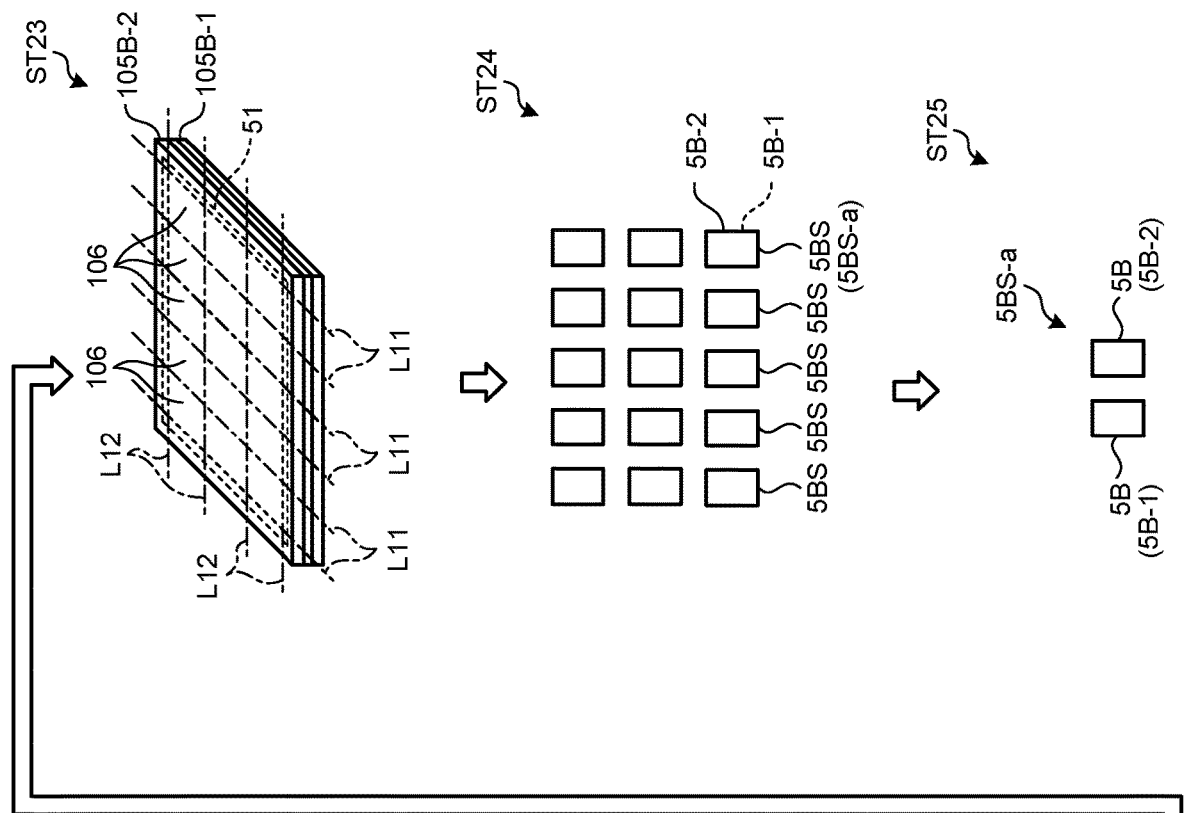
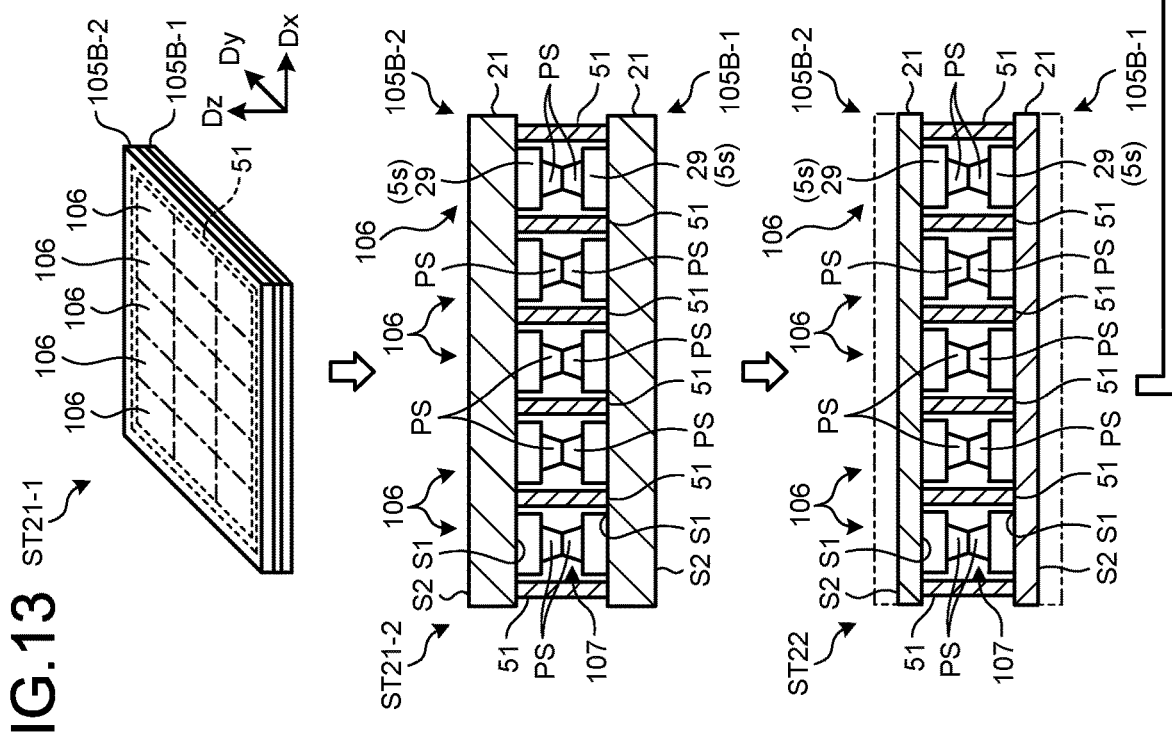

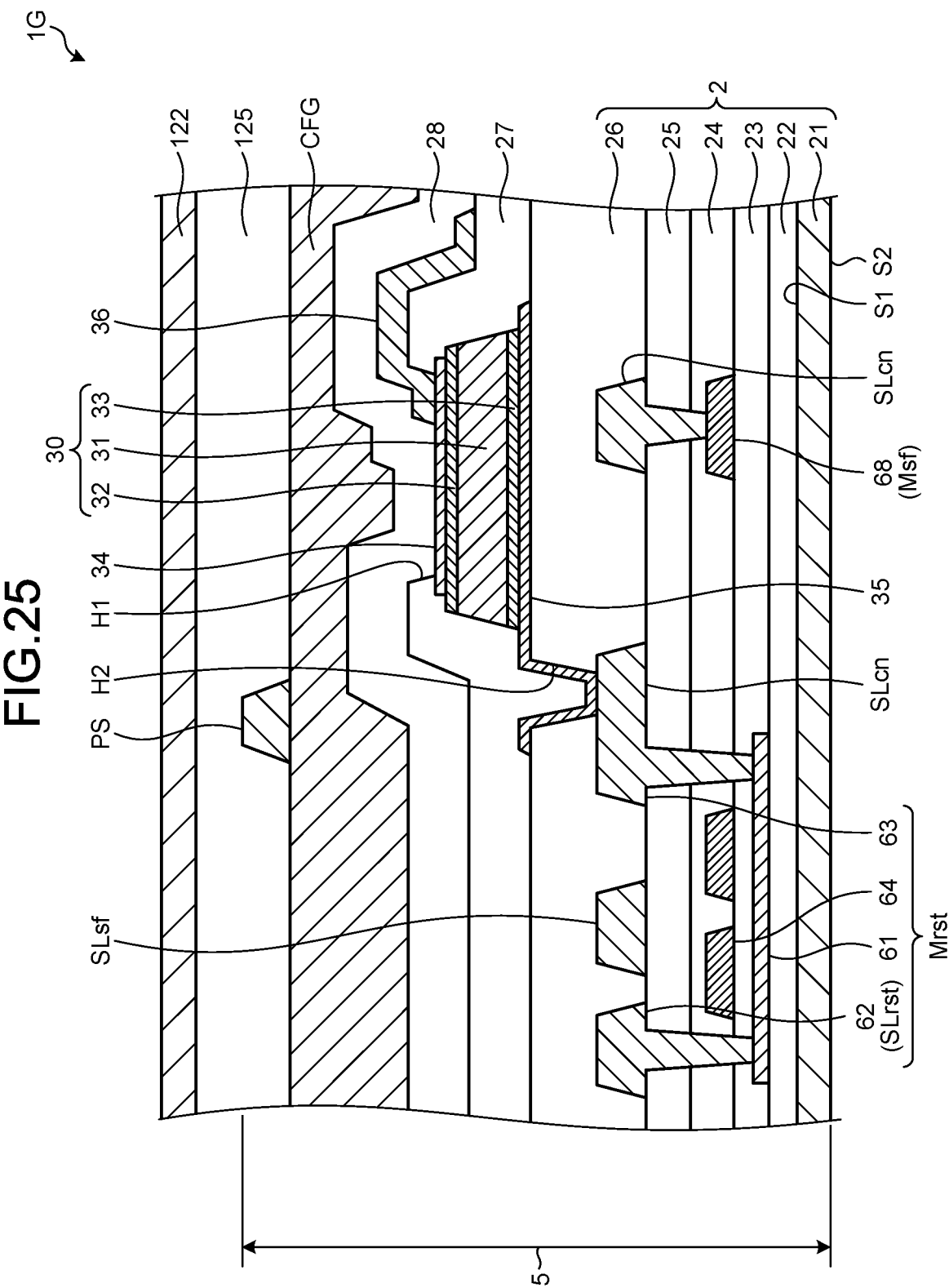

DETECTION DEVICE AND METHOD FOR MANUFACTURING SAME

CROSS-REFERENCE TO RELATED APPLICATION

This application is a continuation of International Patent Application No. PCT/JP2020/040722 filed on Oct. 29, 2020 which designates the United States, incorporated herein by reference, and which claims the benefit of priority from Japanese Patent Application No. 2019-217379 filed on Nov. 29, 2019, incorporated herein by reference.

BACKGROUND

1. Technical Field

The present invention relates to a detection device and a method for manufacturing the same.

2. Description of the Related Art

Japanese Patent Application Laid-open Publication No. 2011-065133 (JP-A-2011-065133) describes a liquid crystal display device including a photosensor. Such a photosensor is used as, for example, a biometric sensor, such as a fingerprint sensor or a vein sensor, that detects biological information. In JP-A-2011-065133, the photosensor is provided on an array substrate for driving a display element, and is disposed between the array substrate and a color filter substrate. The photosensor is not limited to the case of being formed on the same substrate as that of the display element. A configuration is also known in which a detection device including the photosensor is provided on a substrate other than that of the display element.

A detection device including a sensor element, such as the photosensor, is required to be thinner. Unlike a liquid crystal display device, the detection device includes no color filter substrate, and is formed of a single array substrate. In this case, for example, the array substrate may be damaged in a polishing process of the substrate, thus being difficult to be polished.

It is an object of the present invention to provide a detection device that can be thinner and a method for manufacturing the same.

SUMMARY

A detection device according to an embodiment of the present disclosure includes a substrate, a plurality of sensor elements arranged on the substrate, an insulating film provided above the substrate so as to cover the sensor elements, and a first projection that projects from a surface of the insulating film.

A method for manufacturing a detection device according to an embodiment is disclosed. The detection device includes a substrate, a plurality of sensor elements arranged on a first principal surface of the substrate, and an insulating film provided above the substrate so as to cover the sensor elements. The method includes causing the first principal surfaces of a pair of the substrates on each of which the sensor elements, the insulating film, and a first projection projecting from a surface of the insulating film are formed to face each other, and bonding together the pair of the substrates, and polishing a second principal surface of each of the pair of the substrates on a side opposite to the first principal surface in a state where the pair of the substrates are bonded together.

BRIEF DESCRIPTION OF THE DRAWINGS

FIG. 8 is a plan view schematically illustrating an arrangement relation of first projections at Step ST1 of FIG. 7;

FIG. 13 is an explanatory diagram for explaining a method for manufacturing the detection device according to a third modification of the first embodiment;

FIG. 25 is a sectional view illustrating a detection device according to a ninth modification of the third embodiment.

DETAILED DESCRIPTION

Figure 1:
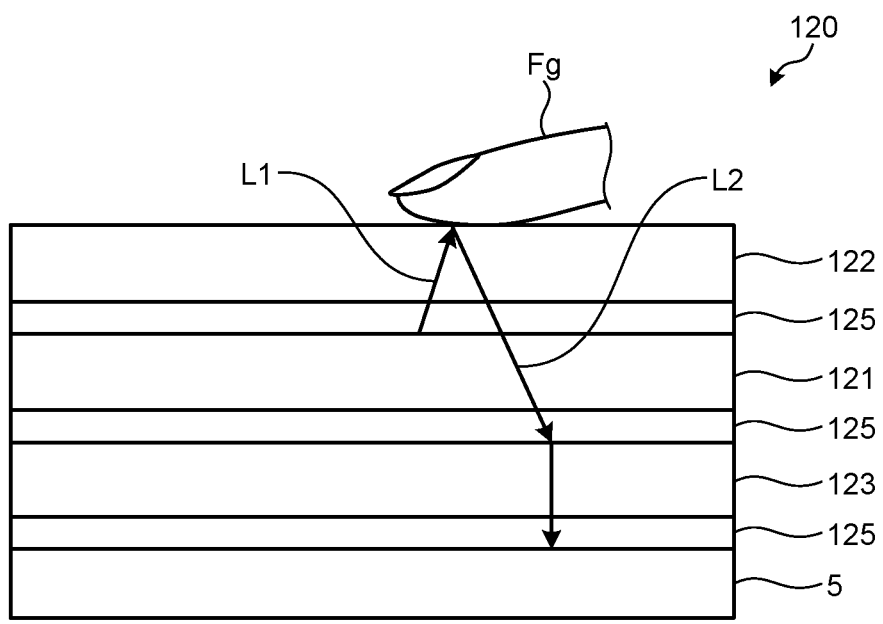
FIG. 1 is a sectional view illustrating a schematic sectional configuration of a detection apparatus including a detection device according to a first embodiment of the present invention.

The following describes modes (embodiments) for carrying out the present invention in detail with reference to the drawings. The present invention is not limited to the description of the embodiments to be given below. Components described below include those easily conceivable by those skilled in the art or those substantially identical thereto. In addition, the components described below can be combined as appropriate. What is disclosed herein is merely an example, and the present invention naturally encompasses appropriate modifications easily conceivable by those skilled in the art while maintaining the gist of the invention. To further clarify the description, the drawings may schematically illustrate, for example, widths, thicknesses, and shapes of various parts as compared with actual aspects thereof. However, they are merely examples, and interpretation of the present invention is not limited thereto. The same component as that described with reference to an already mentioned drawing is denoted by the same reference numeral through the description and the drawings, and detailed description thereof may not be repeated where appropriate.

In the present specification and claims, in expressing an aspect of disposing another structure above a certain structure, a case of simply expressing "above" includes both a case of disposing the other structure immediately above the certain structure so as to contact the certain structure and a case of disposing the other structure above the certain structure with still another structure interposed therebetween, unless otherwise specified.

First Embodiment

FIG. 1 is a sectional view illustrating a schematic sectional configuration of a detection apparatus including a detection device according to a first embodiment of the present invention. As illustrated in FIG. 1, a detection apparatus 120 includes a sensor substrate 5 (detection device 1 (refer to FIG. 2)), a collimator 123, an illumination device 121, adhesive layers 125, and a cover member 122. The sensor substrate 5, one of the adhesive layers 125, the collimator 123, another of the adhesive layers 125, the illumination device 121, still another of the adhesive layers 125, and the cover member 122 are stacked in this order in a direction orthogonal to a surface of the sensor substrate 5.

The illumination device 121 has a light-emitting surface for emitting light, and emits light L1 from the light-emitting surface toward a finger Fg. The illumination device 121 is a light source, and uses, for example, an organic light emitting diode (OLED) that emits light in a predetermined color. The illumination device 121 may use a light-emitting diode (LED).

The light L1 emitted from the illumination device 121 passes through the cover member 122. The sensor substrate 5 can detect asperities (such as a fingerprint) on a surface of the finger Fg by detecting light L2 reflected on the finger Fg. In FIG. 1, the light L2 reflected on the finger Fg is detected by the sensor substrate 5 through the collimator 123. By passing through the collimator 123, the light L2 can be accurately detected by a corresponding sensor, and thus, highly accurate information can be detected. The sensor substrate 5 may detect information on a living body by detecting the light L2 reflected in the finger Fg, in addition to detecting the fingerprint. Examples of the information on the living body include a blood vessel image, pulsation, and a pulse wave of, for example, a vein. The color of the light L1 from the illumination device 121 may be varied according to a detection target. The collimator 123 need not be provided.

The cover member 122 is a member for protecting the illumination device 121, the collimator 123, and the sensor substrate 5, and covers the illumination device 121, the collimator 123 and the sensor substrate 5. The cover member 122 is, for example, a glass substrate. The cover member 122 is not limited to a glass substrate, and may be, for example, a resin substrate. The cover member 122 need not be provided. In this case, a surface of the illumination device 121 is provided with a protective layer of, for example, an insulating film, and the finger Fg contacts the protective layer of the detection apparatus 120.

The detection apparatus 120 may be provided on a display panel. The display panel may be, for example, an organic electroluminescent (EL) diode (organic light-emitting diode (OLED)) panel or an inorganic EL display (micro-LED or mini-LED) panel. Alternatively, the display panel may be a liquid crystal display (LCD) panel using liquid crystal elements as display elements or an electrophoretic display (EPD) panel using electrophoretic elements as display elements. Also, in this case, display light (light L1) emitted from the display panel passes through the sensor substrate 5, and the fingerprint of the finger Fg and the information on the living body can be detected based on the light L2 reflected by the finger Fg. The stacking order of the display panel and the sensor substrate 5 may be reversed. That is, the display panel may be stacked above the sensor substrate 5.

Figure 2:
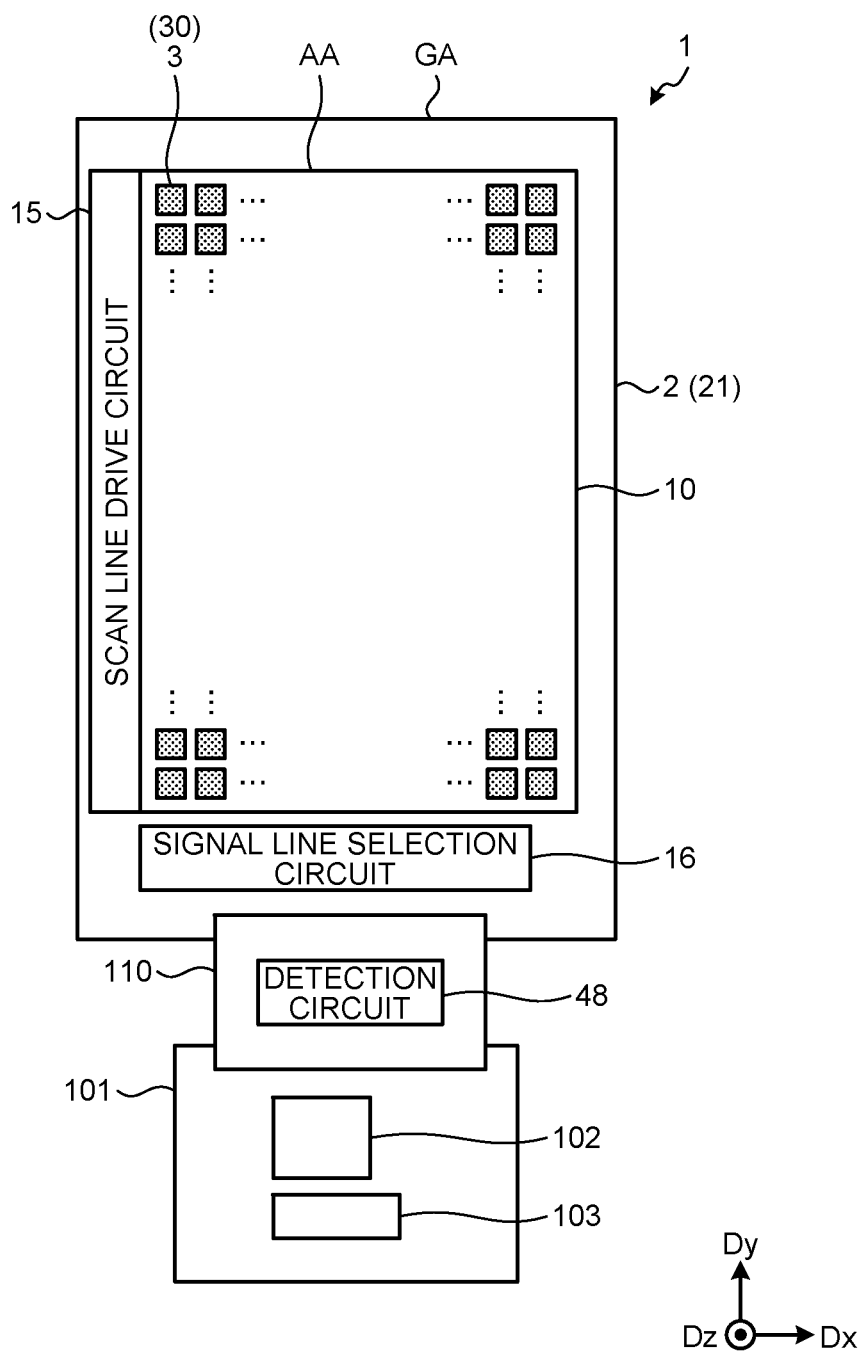
FIG. 2 is a plan view illustrating the detection device according to the first embodiment.

FIG. 2 is a plan view illustrating the detection device according to the first embodiment. As illustrated in FIG. 2, the detection device 1 includes an array substrate 2 (substrate 21), a sensor unit 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor unit 10, the scan line drive circuit 15, and the signal line selection circuit 16 to control a detection operation of the sensor unit 10. The power supply circuit 103 supplies voltage signals including, for example, a power supply potential VDD and a reference potential VCOM (refer to FIG. 4) to the sensor unit 10, the scan line drive circuit 15, and the signal line selection circuit 16. Although the present embodiment exemplifies the case of disposing the detection circuit 48 on the wiring substrate 110, the present invention is not limited to this case. The detection circuit 48 may be disposed above the substrate 21.

The substrate 21 has a detection region AA and a peripheral region GA. The detection region AA is a region provided with a plurality of detection elements 3 included in the sensor unit 10. The peripheral region GA is a region outside the detection region AA, and is a region not provided with the detection elements 3. That is, the peripheral region GA is a region between the outer perimeter of the detection region AA and the ends of the substrate 21. The scan line drive circuit 15 and the signal line selection circuit 16 are provided in the peripheral region GA.

Each of the detection elements 3 of the sensor unit 10 is a photosensor including a photoelectric conversion element 30 as a sensor element. The photoelectric conversion element 30 is a photodiode, and outputs an electrical signal corresponding to light irradiating each of the photoelectric conversion elements 30. More specifically, the photoelectric conversion element 30 is a positive-intrinsic-negative (PIN) photodiode. The detection elements 3 are arranged in a matrix having a row-column configuration in the detection region AA. The photoelectric conversion element 30 included in each of the detection elements 3 performs the detection according to a gate drive signal (for example, a reset control signal RST or a read control signal RD) supplied from the scan line drive circuit 15. Each of the photoelectric conversion elements 30 outputs the electrical signal corresponding to the light irradiating the photoelectric conversion element 30 as a detection signal Vdet to the signal line selection circuit 16. The detection device 1 detects the information on the living body based on the detection signals Vdet received from the photoelectric conversion elements 30.

The scan line drive circuit 15 and the signal line selection circuit 16 are provided in the peripheral region GA. Specifically, the scan line drive circuit 15 is provided in a region extending along a second direction Dy in the peripheral region GA. The signal line selection circuit 16 is provided in a region extending along a first direction Dx in the peripheral region GA, and is provided between the sensor unit 10 and the detection circuit 48.

The first direction Dx is one direction in a plane parallel to the substrate 21. The second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

Figure 3:
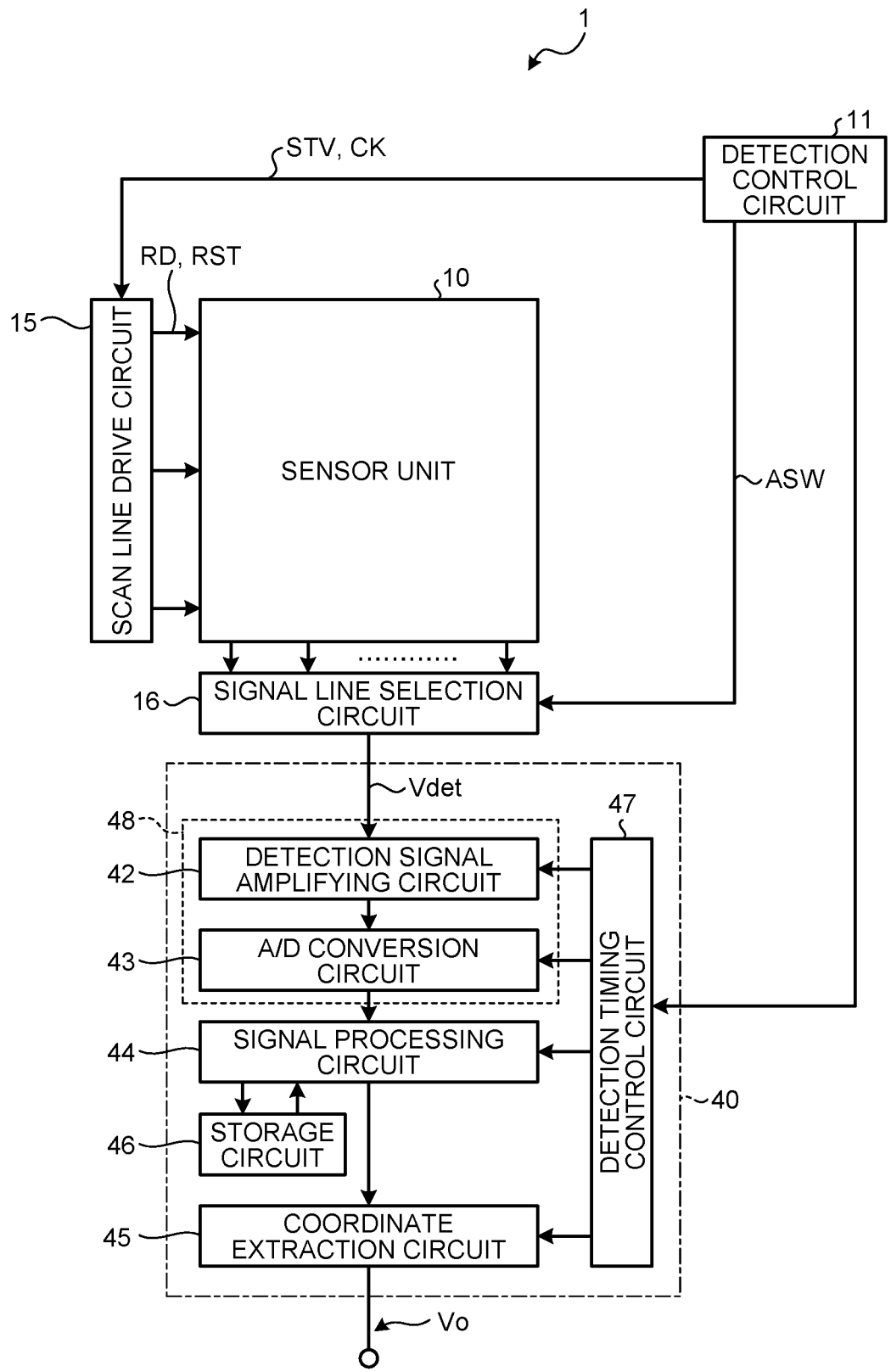
FIG. 3 is a block diagram illustrating a configuration example of the detection device according to the first embodiment.

FIG. 3 is a block diagram illustrating a configuration example of the detection device according to the first embodiment. As illustrated in FIG. 3, the detection device 1 further includes a detection control circuit 11 and a detector 40. One, some, or all functions of the detection control circuit 11 are included in the control circuit 102. One, some, or all functions of the detector 40 other than those of the detection circuit 48 are also included in the control circuit 102.

The detection control circuit 11 is a circuit that supplies respective control signals to the scan line drive circuit 15, the signal line selection circuit 16, and the detector 40 to control operations thereof. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (a read control scan line GLrd and a reset control scan line GLrst (refer to FIG. 4)) based on the various control signals. The scan line drive circuit 15 sequentially or simultaneously selects the scan lines, and supplies the gate drive signals (for example, the reset control signals RST or the read control signals RD) to the selected scan lines. Through this operation, the scan line drive circuit 15 selects the photoelectric conversion elements 30 coupled to the scan lines.

Figure 4:
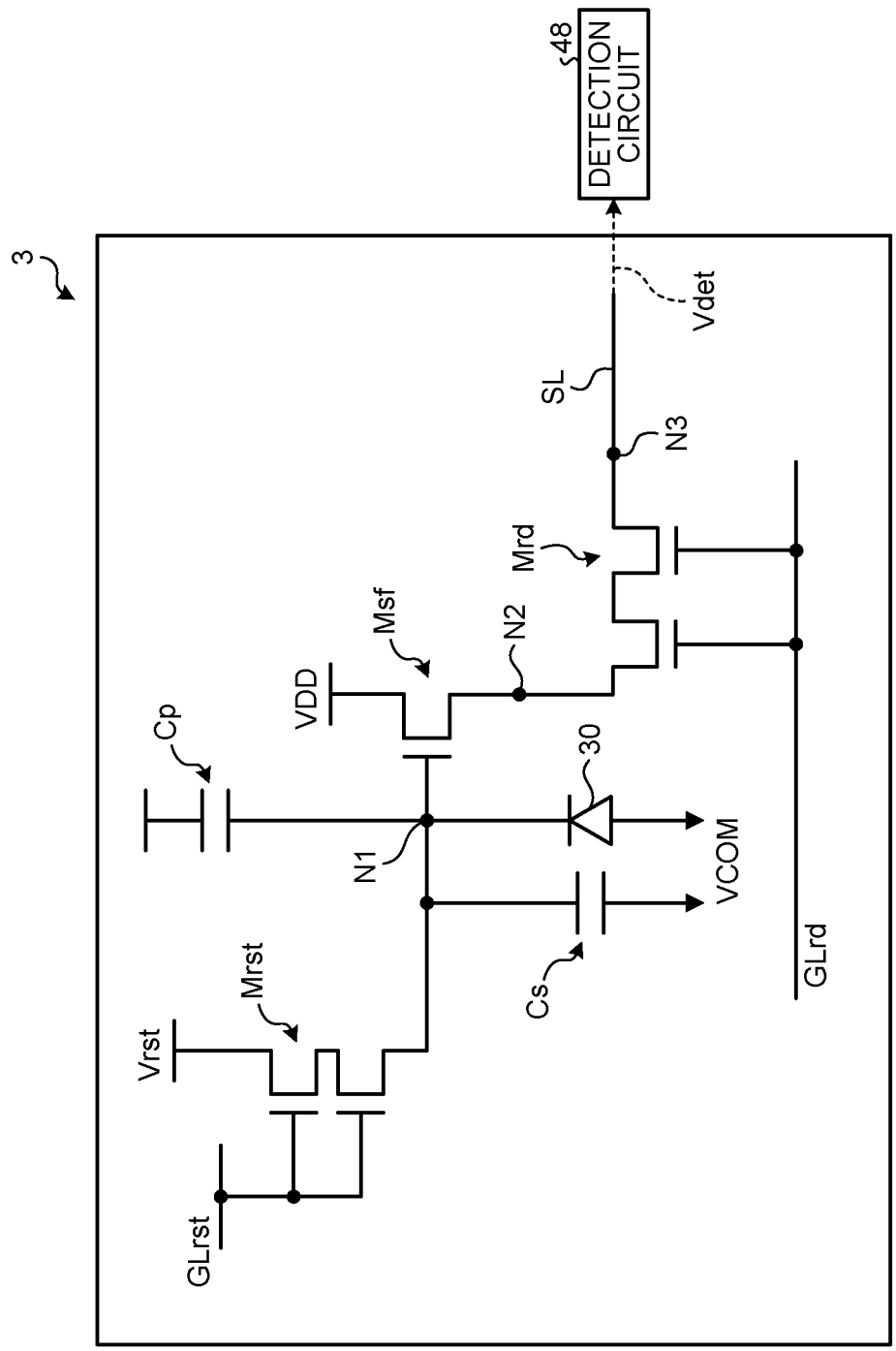
FIG. 4 is a circuit diagram illustrating a detection element.

The signal line selection circuit 16 is a switching circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signal Vdet of the photoelectric conversion element 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 is a circuit that amplifies the detection signal Vdet, and is, for example, an integration circuit. The A/D conversion circuit 43 converts an analog signal output from the detection signal amplifying circuit 42 into a digital signal.

The signal processing circuit 44 is a logic circuit that detects a predetermined physical quantity received by the sensor unit 10 based on output signals of the detection circuit 48. The signal processing circuit 44 can detect asperities on the surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include a blood vessel image, a pulse wave, pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor unit 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection device 1. FIG. 4 is a circuit diagram illustrating the detection element. As illustrated in FIG. 4, the detection element 3 includes the photoelectric conversion element 30, a reset transistor Mrst, a read transistor Mrd, and a source follower transistor Msf. The detection element 3 is provided with the reset control scan line GLrst and the read control scan line GLrd as detection drive lines (scan lines), and provided with a corresponding one of the output signal lines SL as wiring for reading a signal.

While FIG. 4 illustrates one of the detection elements 3, the reset control scan lines GLrst, the read control scan lines GLrd, and the output signal lines SL are coupled to the detection elements 3. Specifically, the reset control scan lines GLrst and the read control scan lines GLrd extend in the first direction Dx (refer to FIG. 2), and are each coupled to the detection elements 3 arranged in the first direction Dx.

The output signal lines SL extend in the second direction Dy, and are each coupled to the detection elements 3 arranged in the second direction Dy.

The reset transistor Mrst, the read transistor Mrd, and the source follower transistor Msf are provided correspondingly to each of the photoelectric conversion elements 30. Each of the transistors included in the detection element 3 is constituted by an n-type thin-film transistor (TFT). However, each of the transistors is not limited thereto, and may be constituted by a p-type TFT.

The reference potential VCOM is applied to the anode of the photoelectric conversion element 30. The cathode of the photoelectric conversion element 30 is coupled to a node N1. The node N1 is coupled to a capacitive element Cs, one of the source and the drain of the reset transistor Mrst, and the gate of the source follower transistor Msf. The node N1 further has parasitic capacitance Cp. When light irradiates the photoelectric conversion element 30, a signal (electric charge) output from the photoelectric conversion element 30 is stored in the capacitive element Cs.

The gates of the reset transistor Mrst are coupled to the reset control scan line GLrst. The other of the source and the drain of the reset transistor Mrst is supplied with a reset potential Vrst. When the reset transistor Mrst is turned on (into a conduction state) in response to the reset control signal RST, the potential of the node N1 is reset to the reset potential Vrst. The reference potential VCOM has a potential lower than the reset potential Vrst, and the photoelectric conversion element 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with a signal (electric charge) generated by the photoelectric conversion element 30. This operation causes the source follower transistor Msf to output a signal voltage corresponding to the signal (electric charge) generated by the photoelectric conversion element 30 to the read transistor Mrd.

The read transistor Mrd is coupled between the source of the source follower transistor Msf (node N2) and the output signal line SL (node N3). The gates of the read transistor Mrd are coupled to the read control scan line GLrd. When the read transistor Mrd is turned on in response to the read control signal RD, the signal output from the source follower transistor Msf, that is, the signal voltage corresponding to the signal (electric charge) generated by the photoelectric conversion element 30 is output as the detection signal Vdet to the output signal line SL.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure, and may have a single-gate structure or a structure configured by coupling three or more transistors in series. The circuit of each of the detection elements 3 is not limited to the configuration including the three transistors of the reset transistor Mrst, the source follower transistor Msf, and the read transistor Mrd. The detection element 3 may have two transistors or four or more transistors.

Figure 5:
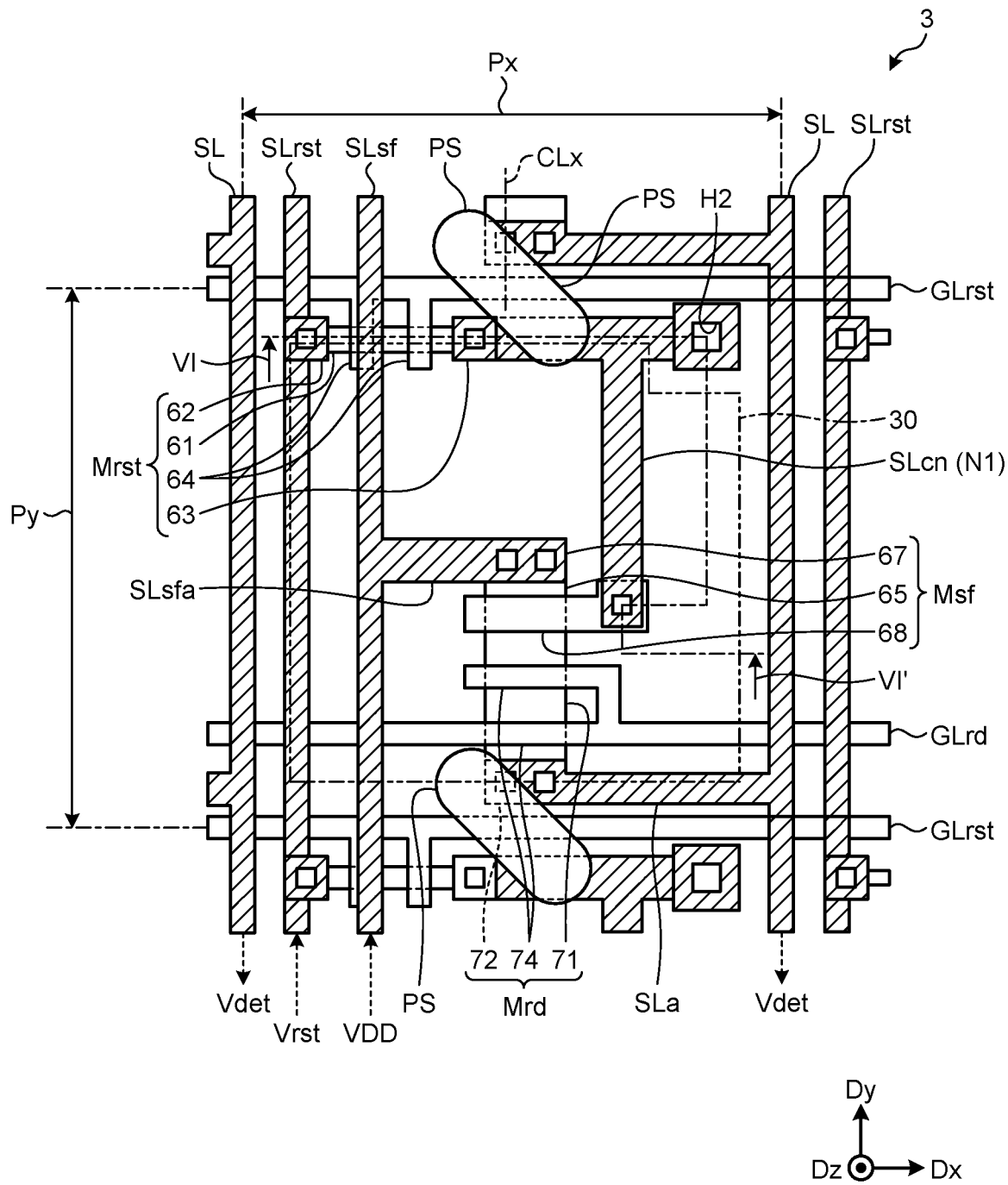
FIG. 5 is a plan view illustrating the detection element.

The following describes a planar configuration and a sectional configuration of the detection element 3. FIG. 5 is a plan view illustrating the detection element. As illustrated in FIG. 5, each of the detection elements 3 includes two scan lines (the read control scan line GLrd and the reset control scan line GLrst) and three signal lines (the output signal line SL, a power supply signal line SLsf, and a reset signal line SLrst).

The read control scan line GLrd and the reset control scan line GLrst each extend in the first direction Dx, and are arranged in the second direction Dy. The output signal line SL, the power supply signal line SLsf, and the reset signal line SLrst each extend in the second direction Dy, and are arranged in the first direction Dx.

The detection element 3 is a region surrounded by two scan lines (for example, two of the reset control scan lines GLrst adjacent to each other in the second direction Dy) and two signal lines (for example, two of the output signal lines SL adjacent to each other in the first direction Dx). An arrangement pitch Px in the first direction Dx of the detector elements 3 is defined by an arrangement pitch of the output signal lines SL. An arrangement pitch Py in the second direction Dy of the detection elements 3 is defined by an arrangement pitch of the reset control scan line GLrst.

The photoelectric conversion element 30 is provided in a region surrounded by two of the reset control scan lines GLrst adjacent in the second direction Dy and two of the output signal lines SL adjacent in the first direction Dx. For ease of viewing, FIG. 5 illustrates the photoelectric conversion element 30 with a long dashed double-short dashed line. The photoelectric conversion element 30 is disposed above the array substrate 2 provided with the various types of wiring and the various transistors, and is provided in a region overlapping at least a portion of the various transistors and at least a portion of the power supply signal line SLsf, the reset signal line SLrst, and the read control scan line GLrd. A detailed structure of the photoelectric conversion element 30 will be described later.

The reset transistor Mrst includes a semiconductor layer 61, a source electrode 62, a drain electrode 63, and gate electrodes 64. One end of the semiconductor layer 61 is coupled to the reset signal line SLrst. The other end of the semiconductor layer 61 is coupled to coupling wiring SLcn. A portion of the reset signal line SLrst coupled to the semiconductor layer 61 serves as the source electrode 62, and a portion of the coupling wiring SLcn coupled to the semiconductor layer 61 serves as the drain electrode 63. The reset control scan line GLrst is provided with two branches branching in the second direction Dy, and the semiconductor layer 61 intersects the two branches of the reset control scan line GLrst. Channel regions are formed in portions of the semiconductor layer 61 that overlap the two branches of the reset control scan line GLrst, and portions of the two branches of the reset control scan line GLrst that overlap the semiconductor layer 61 serve as the gate electrodes 64.

The source follower transistor Msf includes a semiconductor layer 65, a source electrode 67, and a gate electrode 68. One end of the semiconductor layer 65 is coupled to the power supply signal line SLsf through a coupling portion SLsfa. The other end of the semiconductor layer 65 is coupled to the read transistor Mrd. A portion of the coupling portion SLsfa that is coupled to the semiconductor layer 65 serves as the source electrode 67.

One end of the gate electrode 68 is coupled to the coupling wiring SLcn through a contact hole. The semiconductor layer 65 intersects the gate electrode 68. That is, the reset transistor Mrst is electrically coupled to the gate of the source follower transistor Msf through the coupling wiring SLcn.

The cathode (n-type semiconductor layer 33) of the photoelectric conversion element 30 is coupled to the coupling wiring SLcn through a contact hole H2. With this configuration, the cathode (n-type semiconductor layer 33) of the photoelectric conversion element 30 is electrically coupled to the reset transistor Mrst and the source follower transistor Msf through the coupling wiring SLcn.

The read transistor Mrd includes a semiconductor layer 71, a drain electrode 72, and gate electrodes 74. One end of the semiconductor layer 71 is coupled to the semiconductor layer 65 of the source follower transistor Msf. In the present embodiment, the semiconductor layer 65 and the semiconductor layer 71 are formed of a common semiconductor layer. The other end of the semiconductor layer 71 is coupled to the output signal line SL through a coupling portion SLa. In other words, a portion of the coupling portion SLa coupled to the semiconductor layer 71 serves as the drain electrode 72. The read control scan line GLrd is coupled to a branch that is adjacent thereto in the second direction Dy and extends in the first direction Dx. The semiconductor layer 71 intersects the read control scan line GLrd and the branch. Portions of the read control scan line GLrd and the branch that overlap the semiconductor layer 71 serve as the gate electrodes 74. With the above-described configuration, the source follower transistor Msf and the read transistor Mrd are coupled to the output signal line SL.

The planar configuration of the photoelectric conversion element 30 and the transistors illustrated in FIG. 5 is merely an example, and may be changed as appropriate. For example, the transistors are not limited to being arranged in the second direction Dy. Some of the transistors may be provided in different positions, for example, by being arranged adjacent to the other transistors in the first direction Dx. The arrangement of the signal lines and the scan lines may be changed as appropriate according to the arrangement of the transistors.

Figure 6:
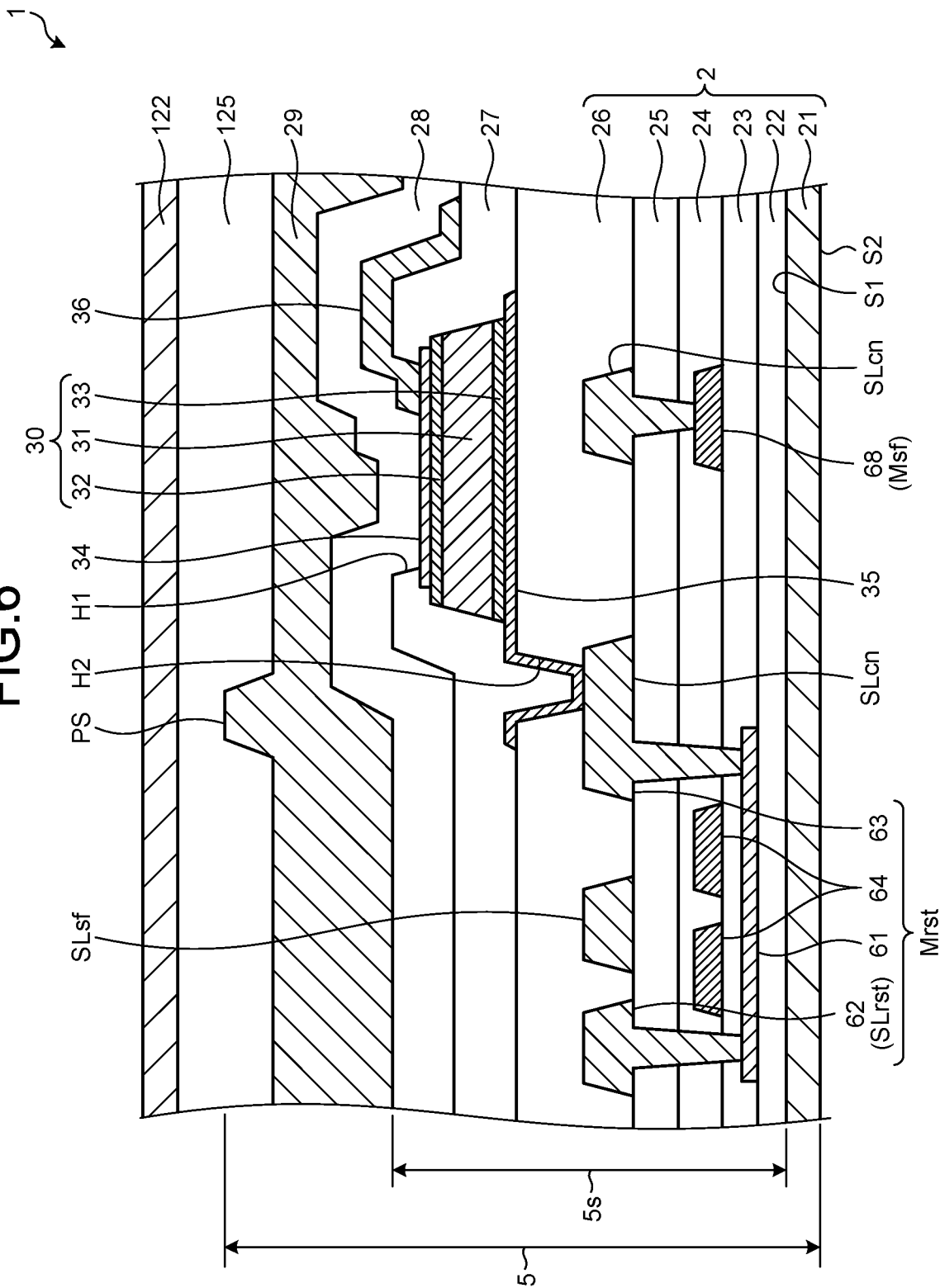
FIG. 6 is a VI-VI' sectional view of FIG. 5.

FIG. 6 is a VI-VI' sectional view of FIG. 5. While FIG. 6 illustrates a sectional configuration of the reset transistor Mrst among the three transistors included in the detection element 3, each of the source follower transistor Msf and the read transistor Mrd also has a sectional configuration similar to that of the reset transistor Mrst.

The substrate 21 is an insulating substrate, and a glass substrate of, for example, quartz or alkali-free glass is used as the substrate 21. The substrate 21 has a first principal surface S1 and a second principal surface S2 on the opposite side of the first principal surface S1. The various transistors including the reset transistor Mrst, the various types of wiring (scan lines and signal lines), and insulating films are provided on the first principal surface S1 of the substrate 21 to form the array substrate 2. The photoelectric conversion elements 30 are arranged above the array substrate 2, that is, on the first principal surface S1 side of the substrate 21.

An undercoat film 22 is provided on the first principal surface S1 of the substrate 21. The undercoat film 22, insulating films 23, 24, and 25, and insulating films 27 and 28 are inorganic insulating films, and are formed of, for example, silicon oxide ($SiO_2$) or silicon nitride (SiN).

The semiconductor layer 61 is provided above the undercoat film 22. For example, polysilicon is used as the semiconductor layer 61. The semiconductor layer 61 is, however, not limited thereto, and may be formed of, for example, a microcrystalline oxide semiconductor, an amorphous oxide semiconductor, or low-temperature polycrystalline silicon (LTPS).

The insulating film 23 is provided above the undercoat film 22 so as to cover the semiconductor layer 61. The gate electrodes 64 are provided above the insulating film 23. The gate electrode 68 of the source follower transistor Msf is provided in the same layer as that of the gate electrodes 64 above the insulating film 23. The reset control scan line GLrst and the read control scan line GLrd (refer to FIG. 5) are also provided in the same layer as that of the gate electrodes 64. The insulating film 24 is provided above the insulating film 23 so as to cover the gate electrodes 64 and 68.

The reset transistor Mrst has a top-gate structure in which the gate electrodes 64 are provided above the semiconductor layer 61, but may have a bottom-gate structure in which the gate electrodes 64 are provided below the semiconductor layer 61, or a dual-gate structure in which the gate electrodes 64 are provided above and below the semiconductor layer 61.

The insulating films 24 and 25 are provided above the insulating film 23 so as to cover the gate electrodes 64. The source electrode 62 and the drain electrode 63 are provided above the insulating film 25. The source electrode 62 and the drain electrode 63 are coupled to the semiconductor layer 61 through contact holes passing through the insulating films 23, 24, and 25. The source electrode 62 and the drain electrode 63 are formed of, for example, a multilayered film of Ti—Al—Ti layers or Ti—Al layers that has a multilayered structure of titanium and aluminum.

The various signal lines (the output signal line SL (refer to FIG. 5), the power supply signal line SLsf, and the reset signal line SLrst) and the coupling wiring SLcn are provided in the same layer as that of the source electrode 62 and drain electrode 63. The coupling wiring SLcn is coupled to the gate electrode 68 of the source follower transistor Msf through a contact hole passing through the insulating films 24 and 25.

An insulating film 26 is provided above the insulating film 25 so as to cover the various transistors including, for example, the reset transistor Mrst. The insulating film 26 is formed of an organic material such as a photosensitive acrylic. The insulating film 26 is thicker than the insulating film 25. The insulating film 26 has a better step covering property than that of inorganic insulating materials, and can planarize steps formed by the various transistors and the various types of wiring.

The following describes a sectional configuration of the photoelectric conversion element 30. The photoelectric conversion element 30 is provided above the insulating film 26. Specifically, a lower conductive layer 35 is provided above the insulating film 26, and is electrically coupled to the coupling wiring SLcn through the contact hole H2. The photoelectric conversion element 30 is coupled to the lower conductive layer 35. In a plan view, the lower conductive layer 35 has a larger area than that of the photoelectric conversion element 30. The lower conductive layer 35 can employ, for example, a multilayered structure of titanium (Ti) and titanium nitride (TiN). Since the lower conductive layer 35 is provided between the substrate 21 and the photoelectric conversion element 30, the lower conductive layer 35 serves as a light-blocking layer, and can restrain light from entering the photoelectric conversion element 30 from the second principal surface S2 side of the substrate 21.

The photoelectric conversion element 30 includes a semiconductor layer having a photovoltaic effect. Specifically, the semiconductor layer of the photoelectric conversion element 30 includes an i-type semiconductor layer 31, a p-type semiconductor layer 32, and the n-type semiconductor layer 33. The i-type semiconductor layer 31, the p-type semiconductor layer 32, and the n-type semiconductor layer 33 are formed of, for example, amorphous silicon (a-Si). The material of the semiconductor layers is not limited thereto, and may be, for example, polysilicon or microcrystalline silicon.

The a-Si of the p-type semiconductor layer 32 is doped with impurities to form a p+ region. The a-Si of the n-type semiconductor layer 33 is doped with impurities to form an n+ region. The i-type semiconductor layer 31 is, for example, a non-doped intrinsic semiconductor, and has lower conductivity than that of the p-type semiconductor layer 32 and the n-type semiconductor layer 33.

The i-type semiconductor layer 31 is provided between the n-type semiconductor layer 33 and the p-type semiconductor layer 32 in a direction orthogonal to a surface of the substrate 21 (in the third direction Dz). In the present embodiment, the n-type semiconductor layer 33, the i-type semiconductor layer 31, and the p-type semiconductor layer 32 are stacked in this order above the lower conductive layer 35.

With this configuration, the n-type semiconductor layer 33 of the photoelectric conversion element 30 is electrically coupled to the reset transistor Mrst and the source follower transistor Msf through the lower conductive layer 35 and the coupling wiring SLcn.

An upper electrode 34 is provided above the p-type semiconductor layer 32. The upper electrode 34 is formed of, for example, a light-transmitting conductive material such as indium tin oxide (ITO). The insulating film 27 is provided above the insulating film 26 so as to cover the photoelectric conversion element 30 and the upper electrode 34. The insulating film 27 is provided with a contact hole H1 in a region overlapping the upper electrode 34.

Coupling wiring 36 is provided above the insulating film 27, and is electrically coupled to the upper electrode 34 through the contact hole H1. The p-type semiconductor layer 32 is supplied with the reference potential VCOM (refer to FIG. 4) through the coupling wiring 36.

The insulating film 28 is provided above the insulating film 27 so as to cover the upper electrode 34 and the coupling wiring 36. The insulating film 28 is provided as a protective layer for restraining water from entering the photoelectric conversion element 30. An insulating film 29 is further provided above the insulating film 28 so as to cover the photoelectric conversion element 30. The insulating film 29 is a hard coat film formed of an organic material. The insulating film 29 planarizes steps on a surface of the insulating film 28 formed by the photoelectric conversion element 30 and the coupling wiring 36. The insulating film 29 is provided with a first projection PS that projects from a surface of the insulating film 29.

The first projection PS can be formed, for example, by exposing the surface of the insulating film 29 using a half-exposure technique. That is, the insulating film 29 and the first projection PS are both formed of an organic material. Alternatively, the first projection PS may be formed by patterning the same organic material on the surface of the insulating film 29. The first projection PS is used as a spacer when overlapping the sensor substrate 5 with another substrate in the manufacturing process of the detection device 1. A method for manufacturing the detection device 1 will be described later.

As illustrated in FIG. 5, the first projection PS is oval or elliptical in the plan view as viewed from the third direction Dz, and the longitudinal direction of the first projection PS is directed in a direction intersecting the first direction Dx and the second direction Dy. The first projection PS is disposed in a position overlapping a center line CLx. The center line CLx is an imaginary line that passes through the midpoint between the output signal lines SL adjacent in the first direction Dx and extends in a direction parallel to the second direction Dy. The first projection PS is provided in a position overlapping the reset control scan line GLrst in the second direction Dy. As a result, the first projection PS is disposed such that an end in the longitudinal direction thereof overlaps the periphery of the photoelectric conversion element 30, and most of the first projection PS does not overlap the photoelectric conversion element 30. This arrangement can restrain reduction in detection accuracy of the photoelectric conversion element 30 even when the first projection PS is provided. The arrangement of the first projection PS can be changed as appropriate. For example, the first projection PS may be provided in a position overlapping at least one of the output signal line SL and the reset signal line SLrst.

Referring back to FIG. 6, in the present embodiment, the sensor substrate 5 includes the array substrate 2, and includes the photoelectric conversion element 30, the coupling wiring 36, the insulating films 27, 28, and 29, and the first projection PS provided above the array substrate 2. In the following description, a multilayered structure from the undercoat film 22 to the insulating film 28 that are stacked above the substrate 21 and include the various transistors and the photoelectric conversion element 30 may be referred to as a sensor layer 5s.

The cover member 122 is provided so as to face the insulating film 29 and the first projection PS. That is, the cover member 122 is provided so as to cover the various transistors and the photoelectric conversion element 30. The adhesive layer 125 covers the upper and side surfaces of the first projection PS, and bonds the insulating film 29 and the first projection PS to the cover member 122. The adhesive layer 125 is provided so as to be tightly attached to the first projection PS. The adhesive layer 125 is, for example, a light-transmitting optically clear adhesive (OCA) sheet.

The refractive index of the adhesive layer 125 has a value close to the refractive index of the insulating film 29 and the first projection PS. The refractive index of the adhesive layer 125 is more preferably substantially equal to the refractive index of the insulating film 29 and the first projection PS. As a result, the detection device 1 can reduce scattering of light at an interface between the adhesive layer 125 and the first projection PS. Therefore, the detection device 1 can restrain reduction in detection accuracy of the photoelectric conversion element 30. The detection device 1 can also restrain reduction in visual quality of a displayed image when the detection device 1 is disposed so as to be superimposed on top of the display panel.

Figure 7:
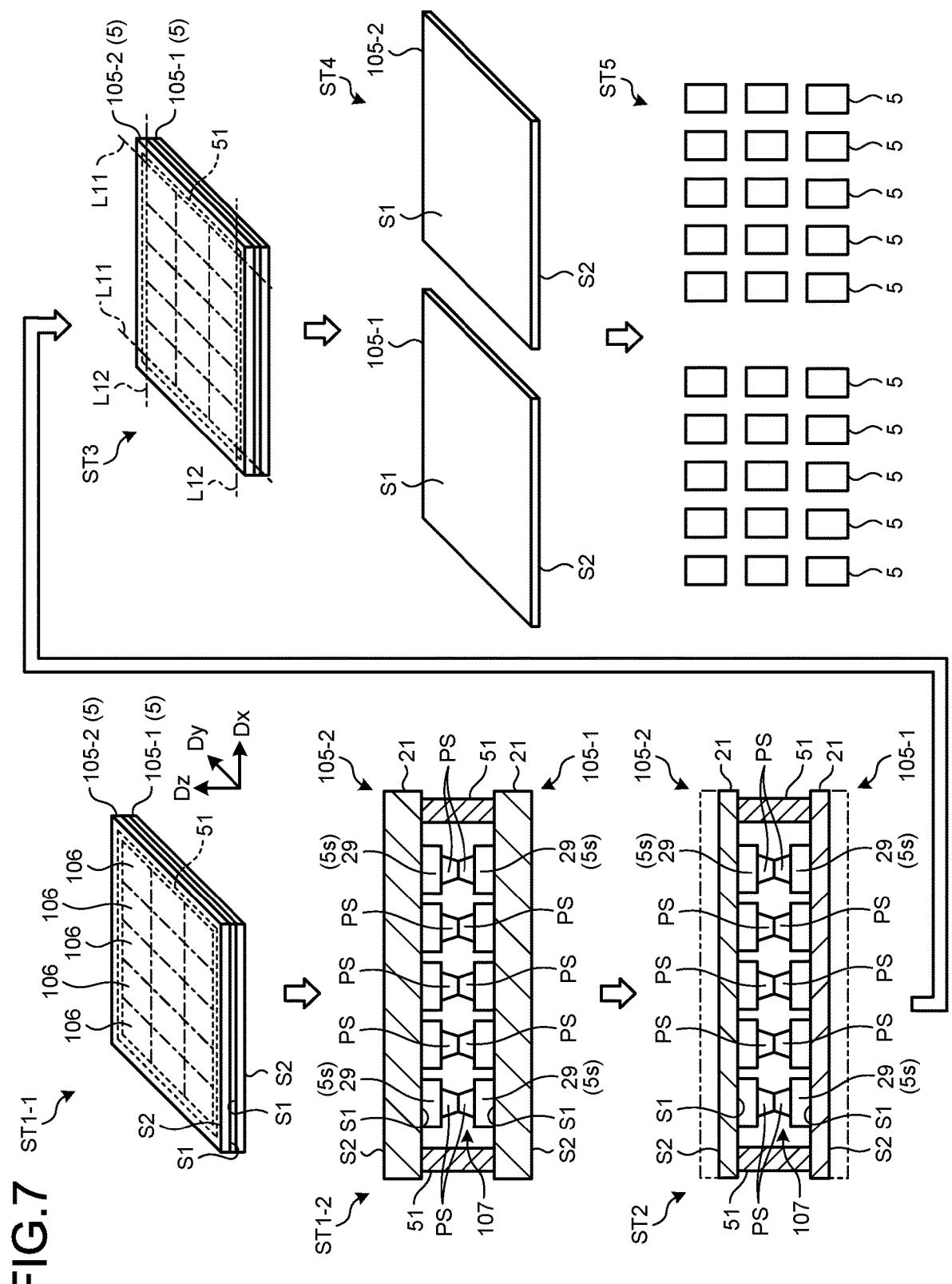
FIG. 7 is an explanatory diagram for explaining a method for manufacturing the detection device according to the first embodiment.

The following describes the method for manufacturing the detection device 1. FIG. 7 is an explanatory diagram for explaining the method for manufacturing the detection device according to the first embodiment. FIG. 7 explains a polishing process and a dicing process of the substrate 21.

As illustrated in FIG. 7, in the method for manufacturing the detection device 1, a pair of mother boards 105 (a first mother board 105-1 and a second mother board 105-2) are first prepared. Step ST1-2 illustrated in FIG. 7 schematically illustrates a sectional view obtained by cutting Step ST1-1 along the first direction Dx. In each of the pair of mother boards 105, a plurality of die formation planned regions 106 are arranged in a matrix having a row-column configuration. The die formation planned regions 106 are regions planned to be divided into dice, and then, each to be formed as the detection device 1.

In the present embodiment, each of the die formation planned regions 106 of the mother boards 105 is formed as the sensor substrate 5. That is, in each of the mother boards 105, the multilayered structure from the substrate 21 to the insulating film 29 and the first projection PS is formed, and includes the transistors, the various types of wiring, and the photoelectric conversion element 30. FIG. 7 does not illustrate the detailed configuration of the sensor layer 5s and the insulating film 29.

Then, a manufacturing device causes the first principal surfaces S1 of the substrates 21 of the pair of mother boards 105 with the insulating films 29 and the first projections PS formed thereon to face each other, and bonds the pair of substrates 21 together (Step ST1-1 and Step ST1-2). As a result, the first projections PS provided on the surfaces of the insulating films 29 are disposed between the first principal surfaces S1 of the pair of substrates 21.

Specifically, the pair of substrates 21 overlap each other such that the first projection PS of the first mother board 105-1 abuts on the first projection PS of the second mother board 105-2. A seal 51 is provided so as to surround the die formation planned regions 106, and seals a gap between the pair of substrates 21. As a result, a gap 107 is formed between the first principal surfaces S1 of the pair of substrates 21, and the pair of substrates 21 are bonded together such that the facing insulating films 29 are not tightly attached to each other. Each of the second principal surfaces S2 of the pair of substrates 21 faces outward.

Figure 9:
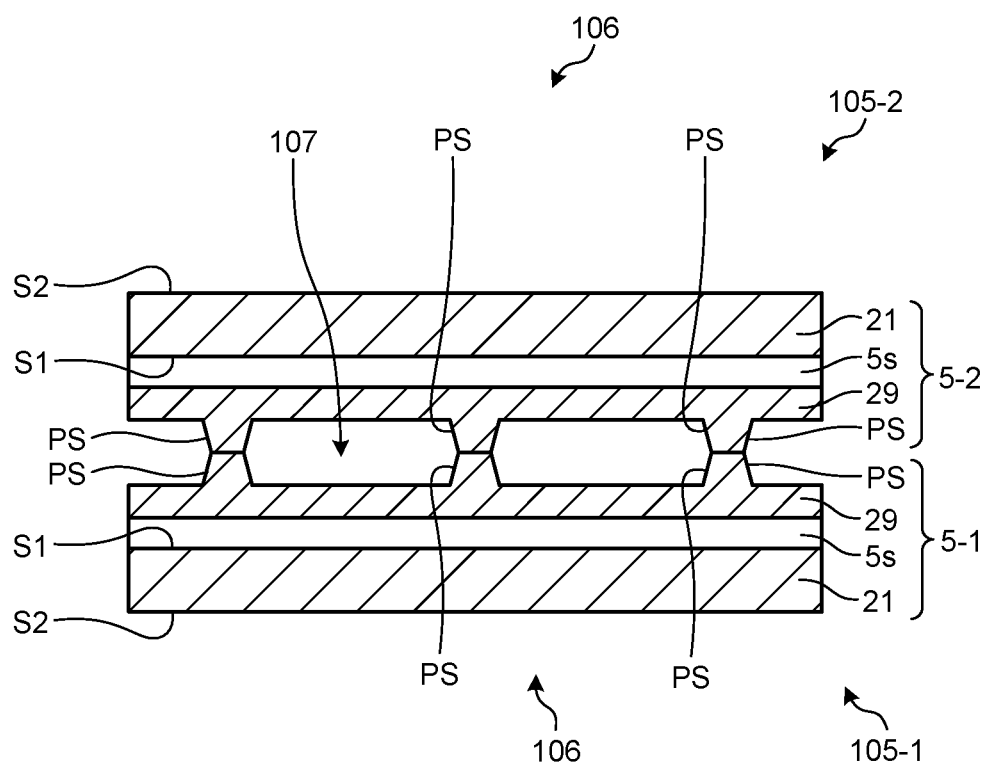
FIG. 9 is a IX-IX' sectional view of FIG. 8.

FIG. 8 is a plan view schematically illustrating an arrangement relation of the first projections at Step ST1 of FIG. 7. FIG. 9 is a IX-IX' sectional view of FIG. 8. FIG. 8 illustrates the first projection PS of the first mother board 105-1 with a dotted line, and the first projection PS of the second mother board 105-2 with a solid line.

As illustrated in FIG. 8, in the state where the pair of substrates 21 are bonded together, at least a portion of the first projection PS provided on one of the substrates 21 (first mother board 105-1) is provided so as to overlap the first projection PS provided on the other of the substrates 21 (second mother board 105-2).

Specifically, longitudinal directions DL1 and DL2 of the first projection PS are oblique to the first direction Dx and the second direction Dy, respectively. Since the pair of substrates 21 are bonded together such that the first principal surfaces S1 face each other, the first projection PS of the first mother board 105-1 and the first projection PS of the second mother board 105-2 overlap each other so as to be horizontally inverted from each other. As a result, the longitudinal direction DL1 of the first projection PS on the one of the substrates 21 (first mother board 105-1) intersects the longitudinal direction DL2 of the first projection PS on the other of the substrates 21 (second mother board 105-2). This configuration can ensure an area of overlap between the first projections PS even if misalignment of positions occurs when the pair of substrates 21 are bonded together.

As illustrated in FIG. 9, the gap 107 is formed between facing sensor substrates 5-1 and 5-2 in each of the die formation planned regions 106. In other words, in the present embodiment, since the first projections PS abut on each other, the insulating film 29 of the sensor substrate 5-1 can be restrained from being tightly attached to the insulating film 29 of the sensor substrate 5-2. The surface of the sensor substrate 5 can be restrained from being damaged when the pair of substrates 21 are bonded together.

Then, referring back to FIG. 7, the manufacturing device polishes the second principal surface S2 of each of the pair of substrates 21 in the state where the pair of substrates 21 are bonded together (Step ST2). The substrate 21 is polished by chemical polishing. Mechanical polishing may be applied to polish the substrate 21. Each of the pair of substrates 21 is thinned from the original thickness by removing the second principal surface S2 side thereof. Thus, in the present embodiment, the pair of substrates 21 can be simultaneously polished by once performing the polishing process. Accordingly, the method for manufacturing the detection device 1 of the present embodiment can reduce the manufacturing cost when compared with a case where an insulating film 97 side of one of the substrates 21 (mother boards 105) is bonded onto another supporting substrate and the polishing process of the substrate 21 is performed.

Then, the manufacturing device removes the seal 51 from the pair of mother boards 105 (Step ST3). Specifically, the pair of mother boards 105 are cut along cutting lines L11 and L12 to remove portions of the seal 51 on outer edge sides of the die formation planned regions 106.

Then, the manufacturing device separates the pair of substrates 21 (the first mother board 105-1 and the second mother board 105-2) (Step ST4). In the present embodiment, since the first projection PS is provided, air can easily enter between the pair of substrates 21, or more specifically, between the facing insulating films 29, allowing a separation process to be easily performed. With this configuration, the first projection PS restrains the pair of substrates 21 from being tightly attached to each other. Therefore, the separation process of the pair of substrates 21 can be easily performed even when the substrates 21 have been thinned by the polishing process. This configuration can also reduce the damage of the substrates 21 in the separation process. As a result, the method for manufacturing the detection device 1 can thin the detection device 1 while restraining the manufacturing cost from increasing.

Then, the manufacturing device forms the sensor substrates 5 by dividing each of the first mother board 105-1 and the second mother board 105-2 into each of the die formation planned regions 106 (Step ST5). Then, the detection device 1 can be manufactured by bonding the cover member 122 to each of the sensor substrates 5.

The method for manufacturing the detection device 1 illustrated in FIGS. 7 to 9 is schematically illustrated for clarity of explanation, and may be changed as appropriate. For example, the die formation planned regions 106 of the mother board 105 are arranged in three rows and five columns. However, in reality, a large number (equal to or larger than 16) of the die formation planned regions 106 may be provided. In FIG. 9, three of the first projections PS are provided in the die formation planned regions 106. However, in reality, the first projections PS are arranged at arrangement pitches corresponding to the arrangement pitches Px and Py of the detection elements 3, and a large number (equal to or larger than four) of the first projections PS are provided. The shape in the plan view of the first projection PS is not limited to an oval or elliptical shape, and may be another shape such as a circular, quadrilateral, or polygonal shape. The shape and size of the first projection PS may differ between the first mother board 105-1 and the second mother board 105-2. The stacking order of the photoelectric conversion element 30 may be reversed. That is, the p-type semiconductor layer 32, the i-type semiconductor layer 31, and the n-type semiconductor layer 33 may be stacked in this order above the array substrate 2.

First Modification

Figure 10:
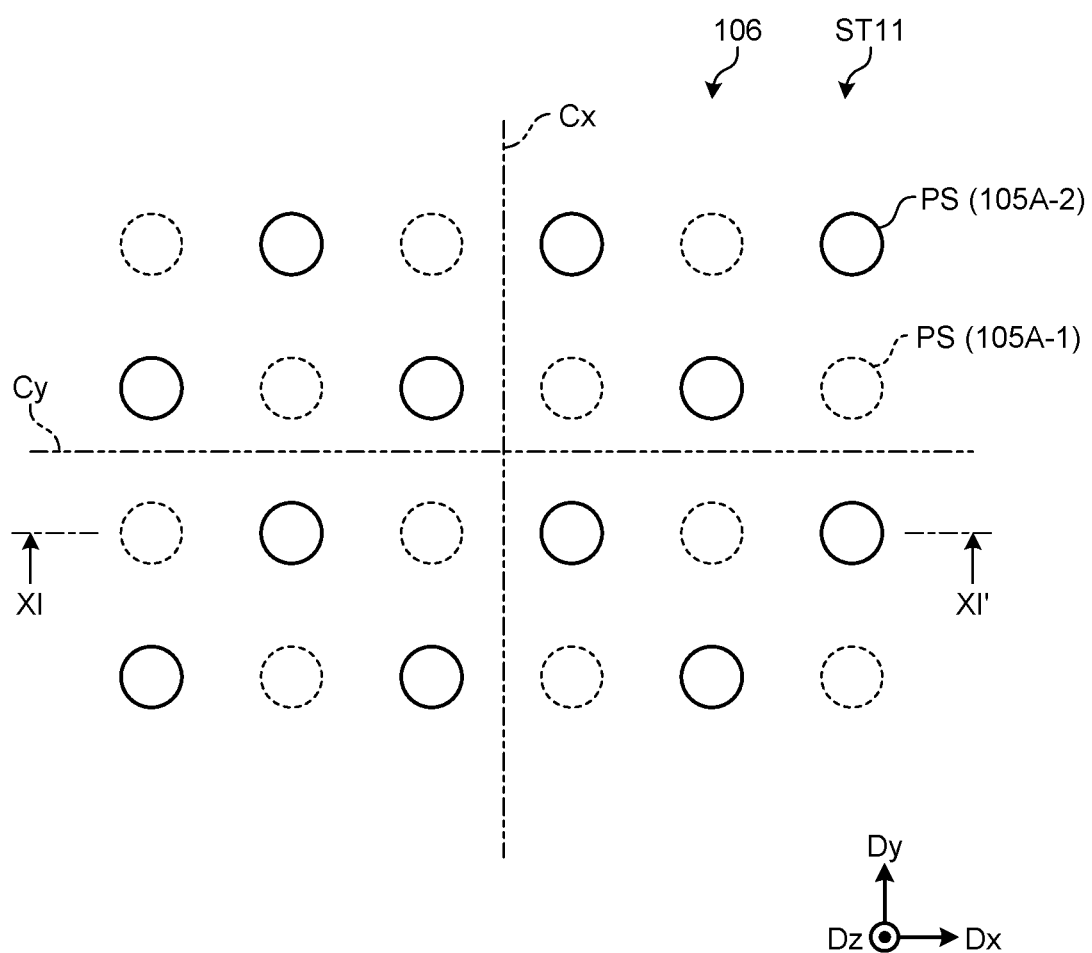
FIG. 10 is a plan view schematically illustrating the arrangement relation of the first projections for explaining a method for manufacturing the detection device according to a first modification of the first embodiment.
Figure 11:
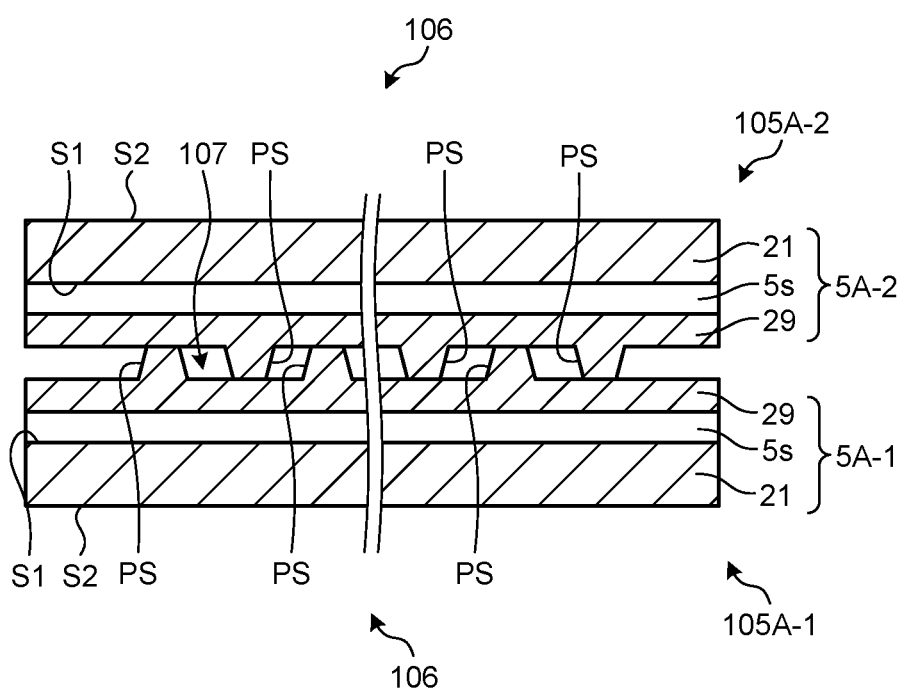
FIG. 11 is a XI-XI' sectional view of FIG. 10.

FIG. 10 is a plan view schematically illustrating the arrangement relation of the first projections for explaining a method for manufacturing the detection device according to a first modification of the first embodiment. FIG. 11 is a XI-XI' sectional view of FIG. 10. In the following description, the same components as those described in the above-described embodiment are denoted by the same reference numerals, and will not be described again.

FIG. 10 illustrates a positional relation of the first projections PS in the state where the pair of substrates 21 (a first mother board 105A-1 and a second mother board 105A-2) are bonded together (Step ST11). As illustrated in FIG. 10, the first projections PS of one of the substrates 21 (first mother board 105A-1) are provided in positions not overlapping the first projections PS of the other of the substrates 21 (second mother board 105A-2) in the plan view. In the first modification, the first projections PS are all circular. However, the first projections PS are not limited thereto, and may have other shapes as described above.

More specifically, in the state where a pair of mother boards 105A are bonded together, the first projections PS provided on the one of the substrates 21 (first mother board 105A-1) and the first projections PS provided on the other of the substrates 21 (second mother board 105A-2) are alternately arranged in the first direction Dx and the second direction Dy.

The first projections PS provided on the one of the substrates 21 (first mother board 105A-1) and the first projections PS provided on the other of the substrates 21 (second mother board 105A-2) are provided in positions symmetric to each other with respect to panel center lines Cx and Cy serving as axes of symmetry. In other words, focusing on one of the substrates 21 (for example, the first mother board 105A-1), no first projections PS are provided in positions symmetric to the first projections PS with respect to the panel center lines Cx and Cy serving as the axes of symmetry.

The panel center line Cx is an imaginary line parallel to the second direction Dy passing through the midpoint between the outer perimeter on one side in the first direction Dx and the outer perimeter on the other side in the first direction Dx of the die formation planned regions 106 arranged on a mother board 105A. In the same manner, the panel center line Cy is an imaginary line parallel to the first direction Dx passing through the midpoint between the outer perimeter on one side in the second direction Dy and the outer perimeter on the other side in the second direction Dy of the die formation planned regions 106 arranged on the mother board 105A.

As illustrated in FIG. 11, the first projection PS of the first mother board 105A-1 abuts on the insulating film 29 of the second mother board 105A-2. In the same manner, the first projection PS of the second mother board 105A-2 abuts on the insulating film 29 of the first mother board 105A-1. Also, in the first modification, the gap 107 is formed between the insulating film 29 of the first mother board 105A-1 and the insulating film 29 of the second mother board 105A-2. Thus, the insulating films 29 can be restrained from being tightly attached to each other.

In the present modification, compared with the first embodiment described above, the first projections PS of the pair of substrates 21 need not be arranged so as to overlap each other. Therefore, the tolerance for positional misalignment in bonding the pair of the substrates 21 can be increased. In addition, compared with the first embodiment, the degree of freedom in shape and size of the first projections PS can be increased. For example, the area of each of the first projections PS in the plan view can be reduced.

Second Modification

Figure 12:
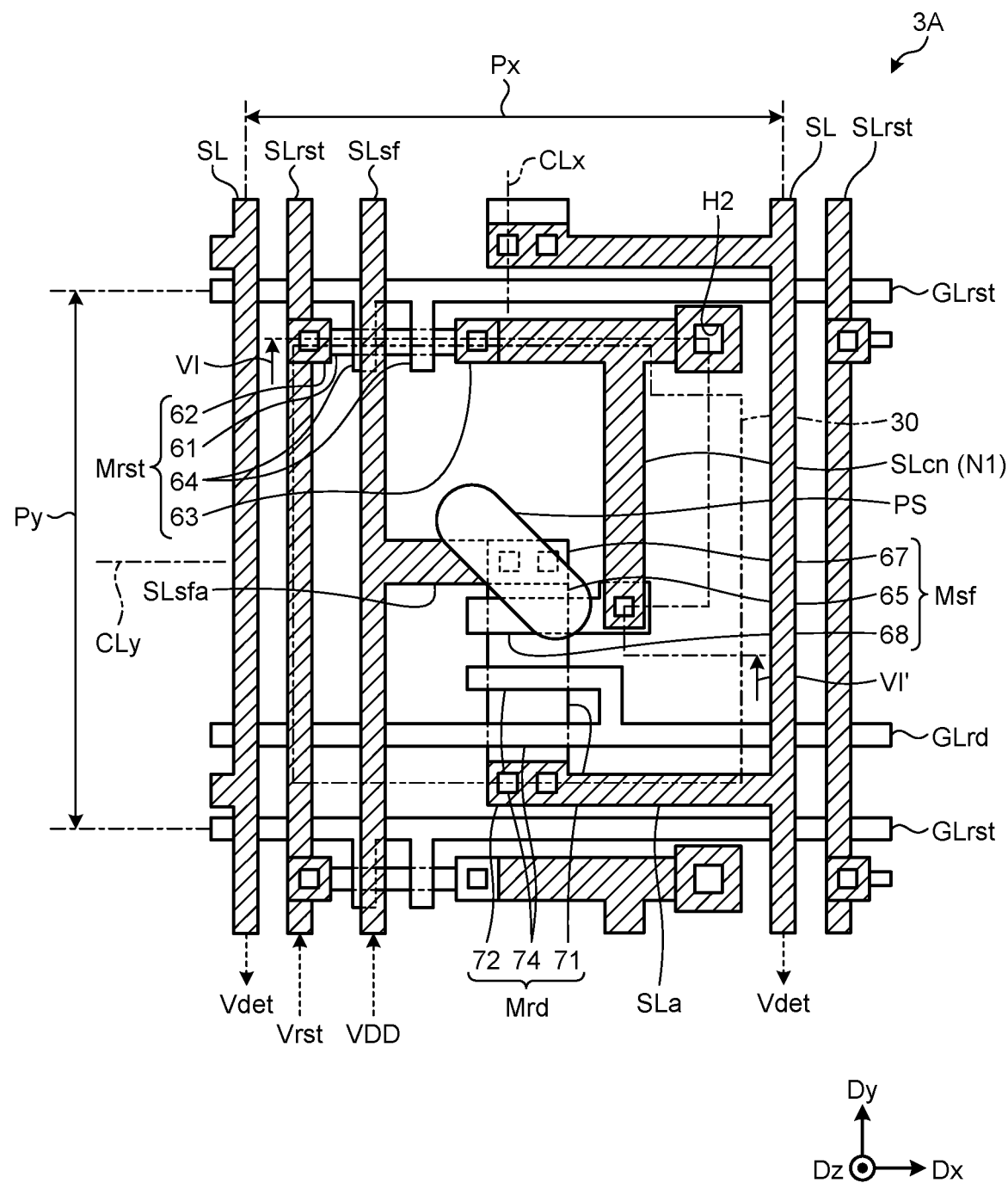
FIG. 12 is a plan view illustrating a detection element in the detection device according to a second modification of the first embodiment.

FIG. 12 is a plan view illustrating a detection element in the detection device according to a second modification of the first embodiment. As illustrated in FIG. 12, in a detection element 3A of the second modification, the first projection PS is disposed so as to overlap the photoelectric conversion element 30 serving as the sensor element in the plan view. The entire first projection PS is disposed so as to overlap the photoelectric conversion element 30. The first projection PS is disposed in the center of the detection element 3A. The first projection PS is provided in a position overlapping an intersection between the center line CLx and the center line CLy. The center line CLy is an imaginary line that passes through the midpoint between the reset control scan lines GLrst adjacent in the second direction Dy and extends in a direction parallel to the first direction Dx.

Even in the aspect in which the first projection PS is disposed so as to overlap the photoelectric conversion element 30, the scattering of light at the interface between the first projection PS and the adhesive layer 125 can be restrained by providing the adhesive layer 125 (refer to FIG. 6) so as to cover the first projection PS in the same manner as in the first embodiment. Therefore, the detection device 1 can restrain reduction in detection accuracy of the photoelectric conversion element 30.

Third Modification

FIG. 13 is an explanatory diagram for explaining a method for manufacturing the detection device according to a third modification of the first embodiment. The method for manufacturing the detection device 1 according to the third modification illustrated in FIG. 13 differs from that of the first embodiment described above in the order of the separation process of the stacked pair of substrates 21 (mother boards 105B) and the division process of the die formation planned regions 106.

Specifically, as illustrated in FIG. 13, in the process of bonding together the pair of substrates 21 (mother boards 105B) (Steps ST21-1 and ST21-2), the seal 51 is provided so as to surround each of the die formation planned regions 106. In other words, the seals 51 are arranged in a grid pattern. In each of the die formation planned regions 106 surrounded by the seal 51, the pair of substrates 21 face each other with the gap 107 interposed therebetween.

After the polishing process of the substrates 21 (Step ST22) is performed in the same manner as in the first embodiment, the pair of substrates 21 (a first mother board 105B-1 and a second mother board 105B-2) in the stacked state are cut into each of the die formation planned regions 106 (Step ST23). Specifically, the pair of substrates 21 are cut along the cutting lines L11 and L12 that are set so as to overlap the seals 51. This operation divides the pair of substrates 21 into layered pairs of dice each forming a sensor substrate stack 5BS (Step ST24). The sensor substrate stack 5BS is constituted by layers of a first sensor substrate 5B-1 and a second sensor substrate 5B-2 obtained by dividing the pair of substrates 21 into the pairs of dice.

Then, each of the sensor substrate stacks 5BS is separated into the first sensor substrate 5B-1 and the second sensor substrate 5B-2 (Step ST25). In the present modification, the separation process of a sensor substrate 5B is performed for each of the sensor substrate stacks 5BS that has been divided into each pair of dice and has a smaller area than that of each of the mother boards 105B. Therefore, the separation process can be performed more easily, and damage to the sensor substrate 5B can be reduced during the separation process.

Fourth Modification

Figure 14:
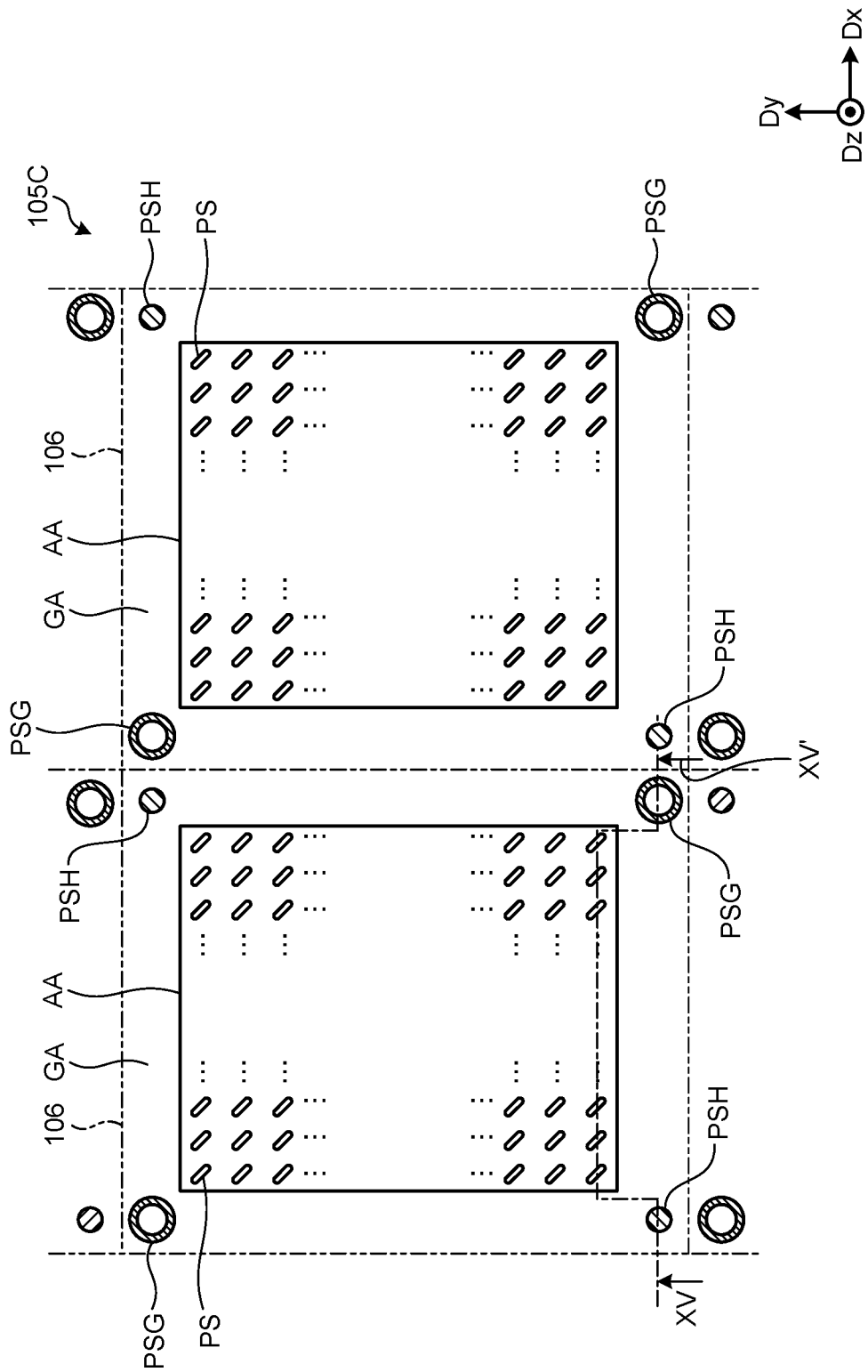
FIG. 14 is a plan view of a mother board for explaining a method for manufacturing the detection device according to a fourth modification of the first embodiment.

FIG. 14 is a plan view of a mother board for explaining a method for manufacturing the detection device according to a fourth modification of the first embodiment. As illustrated in FIG. 14, a mother board 105C of the fourth modification is provided with second projections PSG and third projections PSH in addition to the first projections PS. Each of the second projections PSG is annular in the plan view. Each of the third projections PSH is circular in the plan view, and has an outside diameter smaller than an inside diameter of the second projection PSG.

The first projections PS are provided in a region overlapping the detection region AA of each of the die formation planned regions 106. The second projections PSG and the third projections PSH are provided in a region overlapping the peripheral region GA. The second and the third projections PSG and PSH are provided at corners of the peripheral region GA. In each of the die formation planned regions 106, the second and the third projections PSG and PSH are provided in positions symmetric to each other with respect to an imaginary line parallel to the second direction Dy serving as an axis of symmetry.

The positions and numbers of the second and the third projections PSG and PSH can be changed as appropriate. For example, the second and the third projections PSG and PSH may be arranged in the middle of the long or short sides of the peripheral region GA. Each set of the second and the third projections PSG and PSH may be provided one for each of the die formation planned regions 106, or three or more for each of the die formation planned regions 106. Alternatively, the second and the third projections PSG and PSH need not be provided in all the die formation planned regions 106, and may be provided in some of the die formation planned regions 106.

Figure 15:
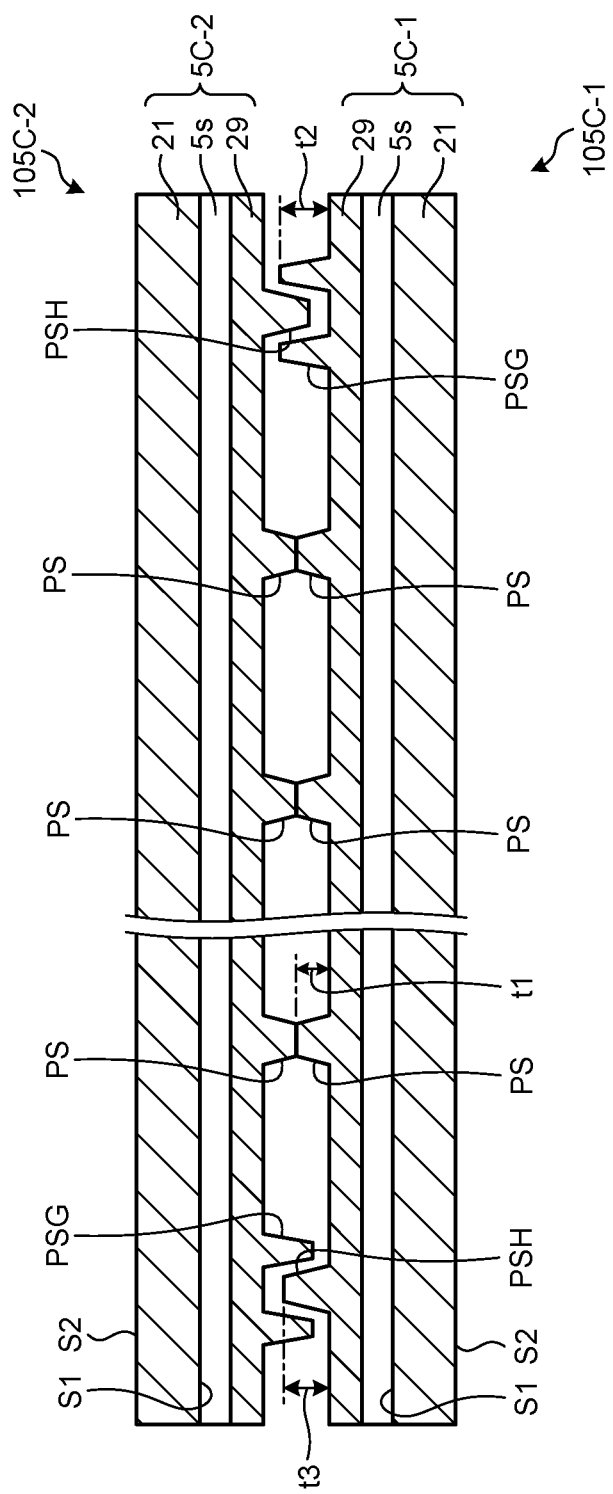
FIG. 15 is a sectional view for explaining the method for manufacturing the detection device according to the fourth modification of the first embodiment.

FIG. 15 is a sectional view for explaining the method for manufacturing the detection device according to the fourth modification of the first embodiment. FIG. 15 illustrates a sectional view cut along line XV-XV' indicated in FIG. 14 in the case where the pair of substrates 21 (a first mother board 105C-1 and a second mother board 105C-2) are bonded together.

As illustrated in FIG. 15, in the state where the pair of substrates 21 (the first mother board 105C-1 and the second mother board 105C-2) are bonded together, the second projection PSG and the third projection PSH facing each other engage with each other. The third projection PSH provided on the other of the substrates 21 is disposed in a recess formed in the second projection PSG provided on one of the substrates 21. In FIG. 15, the second projection PSG and the third projection PSH are illustrated in a non-contact state. However, the second projection PSG may be in contact with the third projection PSH.

A height t2 of the second projection PSG and a height t3 of the third projection PSH are larger than a height t1 of the first projection PS. With this configuration, the second projection PSG engages with the third projection PSH even though the first projections PS of the pair of substrates 21 (the first mother board 105C-1 and the second mother board 105C-2) are in contact with each other.

In the present modification, since the second and the third projections PSG and PSH are provided, the misalignment of positions of the pair of substrates 21 (the first mother board 105C-1 and the second mother board 105C-2) can be reduced. As a result, the misalignment of positions of the facing first projections PS is reduced. Therefore, the facing first projections PS contact each other to provide the gap 107 between the pair of substrates 21 (the first mother board 105C-1 and the second mother board 105C-2). In the process of separating the pair of substrates 21 (the first mother board 105C-1 and the second mother board 105C-2) (refer to Step ST4 in FIG. 7 or Step ST25 in FIG. 13), possible damage of the surface of the insulating film 29 can be restrained from occurring due to horizontal misalignment between the pair of substrates 21 (the first mother board 105C-1 and the second mother board 105C-2).

The configuration of the fourth modification can be combined with that of any of the first to the third modifications described above.

Second Embodiment

Figure 16:
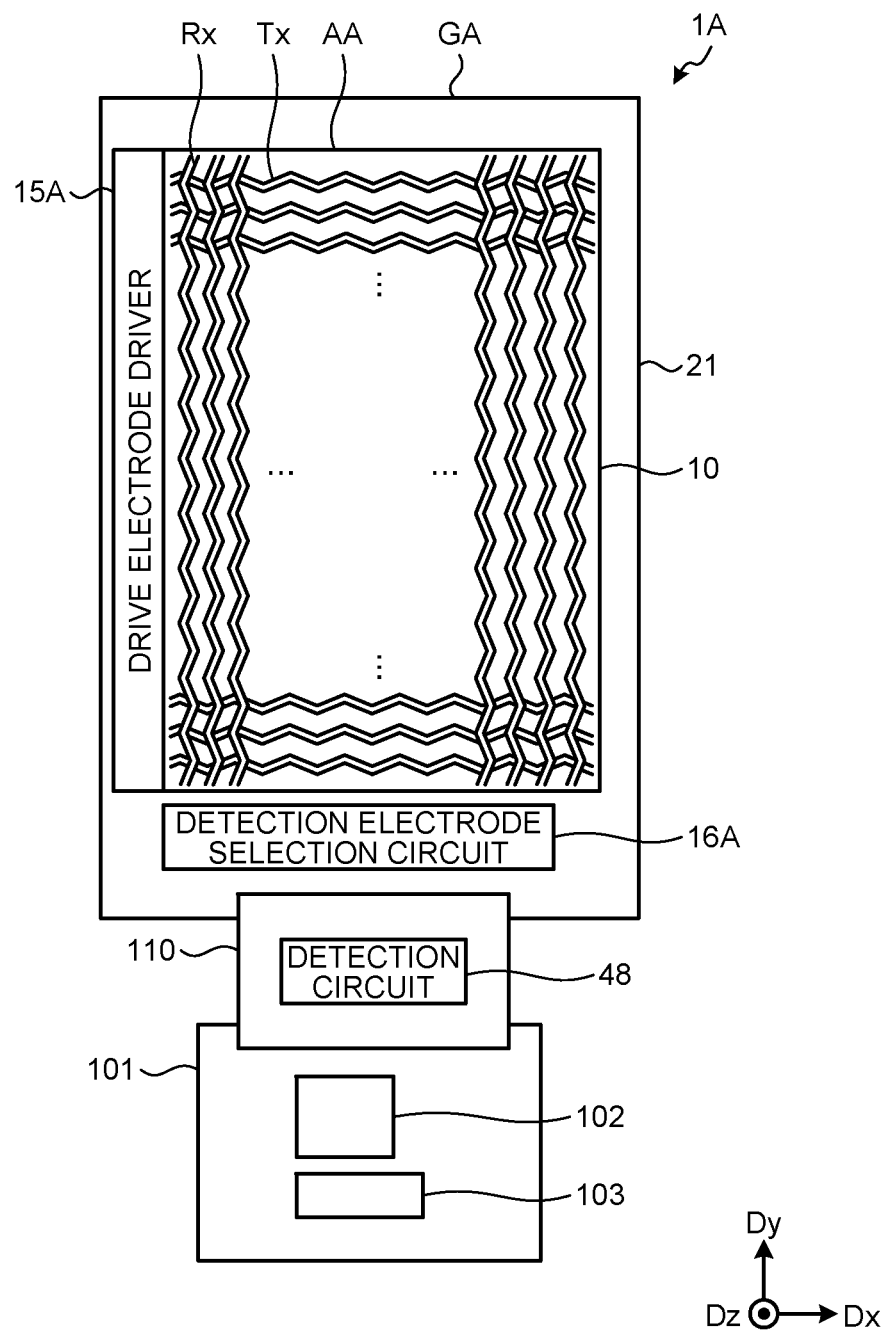
FIG. 16 is a plan view illustrating a detection device according to a second embodiment of the present invention.

FIG. 16 is a plan view illustrating a detection device according to a second embodiment of the present invention. In the first embodiment described above, the photosensor employing the photoelectric conversion element 30 as the sensor element has been exemplified. However, the sensor element is not limited thereto. A detection device 1A of the second embodiment employs an electrostatic touch sensor as the sensor element.

Specifically, as illustrated in FIG. 16, the detection device 1A includes the substrate 21, a plurality of drive electrodes Tx, a plurality of detection electrodes Rx, a drive electrode driver 15A, and a detection electrode selection circuit 16A.

In the same manner as in the first embodiment, the substrate 21 is a light-transmitting glass substrate that can transmit visible light. The drive electrodes Tx and the detection electrodes Rx are provided in the detection region AA of the substrate 21. The drive electrodes Tx and the detection electrodes Rx are each in the form of a zigzag line. The drive electrodes Tx are arranged in the second direction Dy, and each extend in the first direction Dx. The detection electrodes Rx extend in a direction intersecting the extending direction of the drive electrodes Tx. That is, the detection electrodes Rx are arranged in the first direction Dx, and each extend in the second direction Dy.

Each of the drive electrodes Tx and the detection electrodes Rx is constituted by one thin metal wire. Aluminum, copper, silver, molybdenum, or an alloy thereof is used as a material of the thin metal wire constituting each of the drive electrodes Tx and the detection electrodes Rx. An insulating film 135 (refer to FIG. 17) is provided between the drive electrode Tx and the detection electrode Rx. This configuration insulates the drive electrode Tx from the detection electrode Rx.

Electrostatic capacitance is generated at each of intersections between the drive electrodes Tx and the detection electrodes Rx. That is, each of the intersections between the drive electrodes Tx and the detection electrodes Rx serves as the sensor element. When the detection device 1A performs mutual capacitance touch detection, the drive electrode driver 15A sequentially selects the drive electrodes Tx in a time-division manner, and supplies drive signals to the selected drive electrodes Tx. Then, the detection signal Vdet corresponding to a change in capacitance caused by the finger Fg or the like in contact with or in proximity to the detection surface is output from the detection electrode Rx to perform the touch detection. The drive electrode driver 15A may sequentially select each drive electrode block including the drive electrodes Tx, and drive the drive electrodes Tx in the selected drive electrode block.

The detection electrode selection circuit 16A selects the detection electrode Rx and couples the selected detection electrode Rx to the detection circuit 48 based on a control signal supplied from the control circuit 102. The detection electrode selection circuit 16A need not be provided. In this case, the detection electrodes Rx may be directly coupled to the detection circuit 48.

Figure 17:
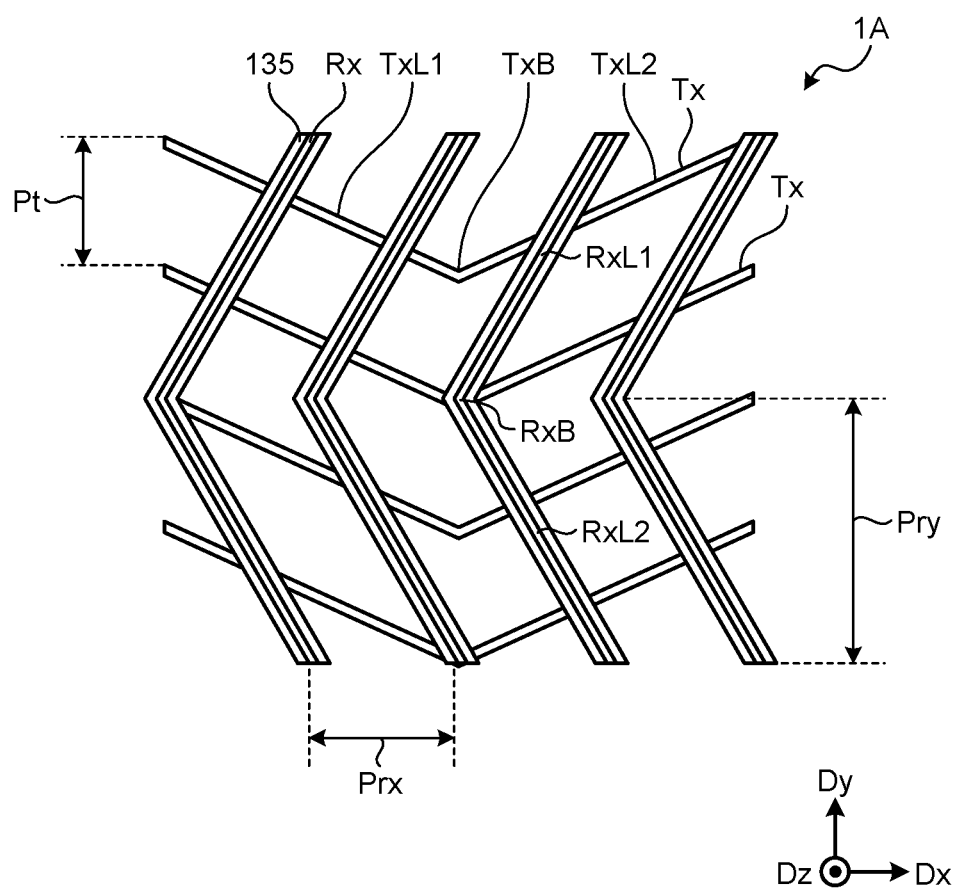
FIG. 17 is a plan view illustrating drive electrodes and detection electrodes according to the second embodiment.

FIG. 17 is a plan view illustrating the drive electrodes and the detection electrodes according to the second embodiment. As illustrated in FIG. 17, the drive electrode Tx extends in the first direction Dx in the form of a zigzag line. For example, the drive electrode Tx has a plurality of first straight line portions TxL1, a plurality of second straight line portions TxL2, and a plurality of bent portions TxB. The second straight line portions TxL2 extend in a direction intersecting the first straight line portions TxL1. The bent portions TxB couple the first straight line portions TxL1 to the second straight line portions TxL2.

The detection electrode Rx extends in the second direction Dy in the form of a zigzag line. For example, the detection electrode Rx has a plurality of first straight line portions RxL1, a plurality of second straight line portions RxL2, and a plurality of bent portions RxB. The second straight line portions RxL2 extend in a direction intersecting the first straight line portions RxL1. The bent portions RxB couple the first straight line portions RxL1 to the second straight line portions RxL2.

In the drive electrode Tx and the detection electrode Rx, the first straight line portions TxL1 and RxL1 and the second straight line portions TxL2 and RxL2 all extend in directions intersecting the first direction Dx and the second direction Dy.

In each of the detection electrodes Rx, Pry denotes the arrangement interval of the bent portions RxB in the second direction Dy. Prx denotes the arrangement interval of the bent portions RxB in the first direction Dx between the adjacent detection electrodes Rx. In the present embodiment, for example, a relation Prx<Pry holds. An arrangement interval Pt of the drive electrodes Tx in the second direction Dy is approximately half the arrangement interval Pry.

With such a configuration of the drive electrodes Tx and the detection electrodes Rx, the detection device 1A can reduce generation of unintended patterns such as moiré patterns. The shapes and the arrangement intervals of the drive electrodes Tx and the detection electrodes Rx can be changed as appropriate. In FIG. 17, the insulating film 135 is provided in a region overlapping the detection electrode Rx, but is not limited to this region, and may be provided in the entire detection region AA.

Figure 18:
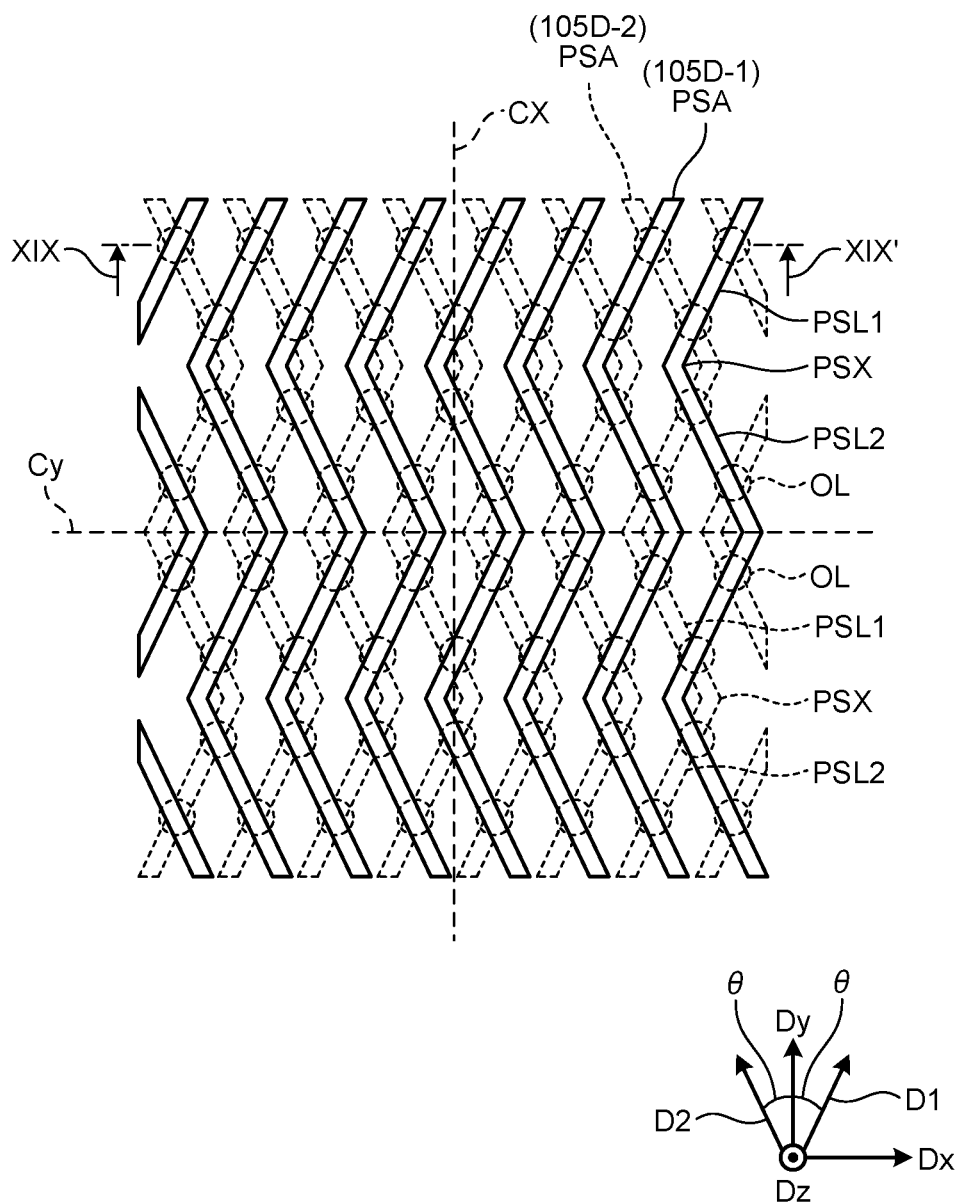
FIG. 18 is a plan view for explaining an arrangement relation of first projections according to the second embodiment.

FIG. 18 is a plan view for explaining an arrangement relation of first projections according to the second embodiment. FIG. 18 illustrates a configuration of first projections PSA in the case where the pair of substrates 21 (a first mother board 105D-1 and a second mother board 105D-2) are bonded together. For ease of viewing, FIG. 18 illustrates each of the first projections PSA of the second mother board 105D-2 with a dotted line.

As illustrated in FIG. 18, the first projection PSA extends in the second direction Dy while zigzagging in the same manner as the detection electrode Rx. The first projections PSA are arranged so as to overlap the detection electrodes Rx (refer to FIG. 19). For example, the first projection PSA has a plurality of first straight line portions PSL1, a plurality of second straight line portions PSL2, and a plurality of bent portions PSX. The first straight line portions PSL1 and the second straight line portions PSL2 of the first projection PSA are arranged so as to overlap the first straight line portions RxL1 and the second straight line portions RxL2 of the detection electrode Rx, respectively.

The first straight line portions PSL1 extend in a direction D1. The second straight line portions PSL2 extend in a direction D2 intersecting the first straight line portions RxL1. The directions D1 and D2 are inclined in directions opposite to each other with respect to the second direction Dy. The absolute values of an angle formed by the direction D1 and the second direction Dy and an angle formed by the direction D2 and the second direction Dy are both equal to an angle θ. The bent portions PSX couple the first straight line portions PSL1 to the second straight line portions PSL2.

The pair of substrates 21 (the first mother board 105D-1 and the second mother board 105D-2) overlap each other so as to be horizontally inverted from each other, and the first projections PSA provided on one of the substrates 21 (first mother board 105D-1) and the first projections PSA provided on the other of the substrates 21 (second mother board 105D-2) are arranged so as to overlap each other at intersections OL therebetween.

Figure 19:
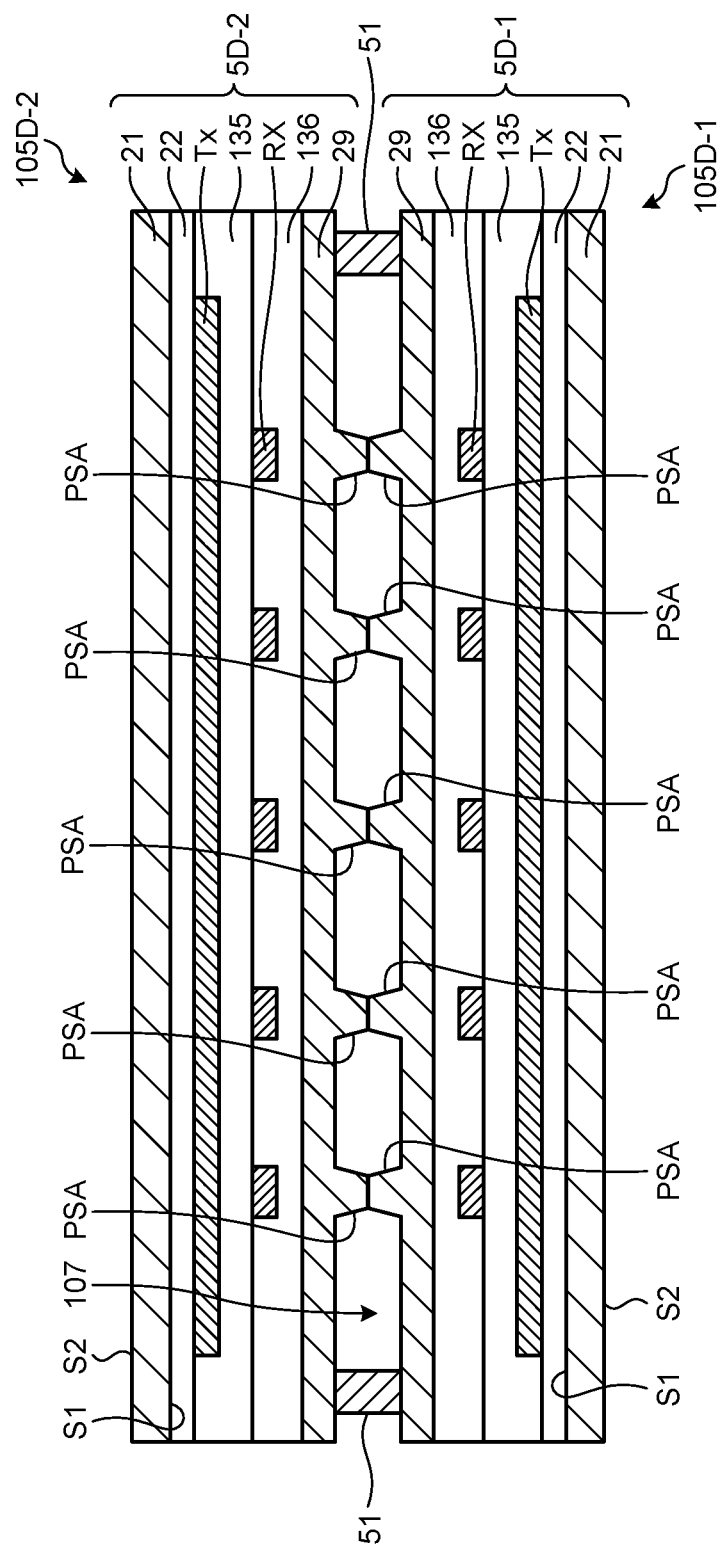
FIG. 19 is a XIX-XIX' sectional view of FIG. 18.

FIG. 19 is a XIX-XIX' sectional view of FIG. 18. As illustrated in FIG. 19, the first mother board 105D-1 and the second mother board 105D-2 are constituted by sensor substrates 5D-1 and 5D-2, respectively. Although not illustrated in FIG. 19, transistors of peripheral circuits (the drive electrode driver 15A and the detection electrode selection circuit 16A) are formed in the peripheral region GA of each of the sensor substrates 5D-1 and 5D-2.

As illustrated in FIG. 19, in each of the sensor substrates 5D-1 and 5D-2, the undercoat film 22, the drive electrode Tx, the insulating film 135, the detection electrodes Rx, an insulating film 136, and the insulating film 29 are stacked in this order above the first principal surface S1 of the substrate 21. The first projections PSA project from the surface of the insulating film 29. The first projections PSA are arranged so as to overlap the respective detection electrodes Rx. The insulating films 135 and 136 are inorganic insulating films. The insulating film 29 is an organic insulating film in the same manner as in the first embodiment. The insulating film 29 may be provided so as to directly cover the detection electrodes Rx without the insulating film 136 being provided.

Also, in the present embodiment, the pair of substrates 21 (the first mother board 105D-1 and the second mother board 105D-2) are bonded together such that the first principal surfaces S1 thereof face each other, and the facing first projections PSA abut on each other. This configuration forms the gaps 107 between the pair of substrates 21, or more specifically, between the facing insulating films 29.

As a result, also in the case of the detection device 1A provided with the electrostatic touch sensor as the sensor element, the second principal surfaces S2 of the pair of substrates 21 can be simultaneously polished in the manufacturing process, in the same manner as in the processes illustrated in FIGS. 7 and 13. In addition, damage can be restrained from occurring when the two substrates 21 (the first mother board 105D-1 and the second mother board 105D-2) are separated.

The configuration of the drive electrodes Tx and the detection electrodes Rx can be changed as appropriate. For example, the drive electrodes Tx may be formed in a rectangular shape using a light-transmitting conductive material such as ITO. Although what is called a mutual capacitance touch sensor has been illustrated to be used in the detection device 1A, a self-capacitance touch sensor may be used. That is, the detection device 1A may have a configuration that includes the arranged detection electrodes Rx without including the drive electrodes Tx. The first projections PSA are not limited to the configuration of being arranged so as to overlap the detection electrodes Rx, and may be arranged so as to overlap the drive electrodes Tx. The first projections PS of the first embodiment may be provided above the electrostatic touch sensor (driving electrodes Tx and detection electrodes Rx).

Third Embodiment

Figure 20:
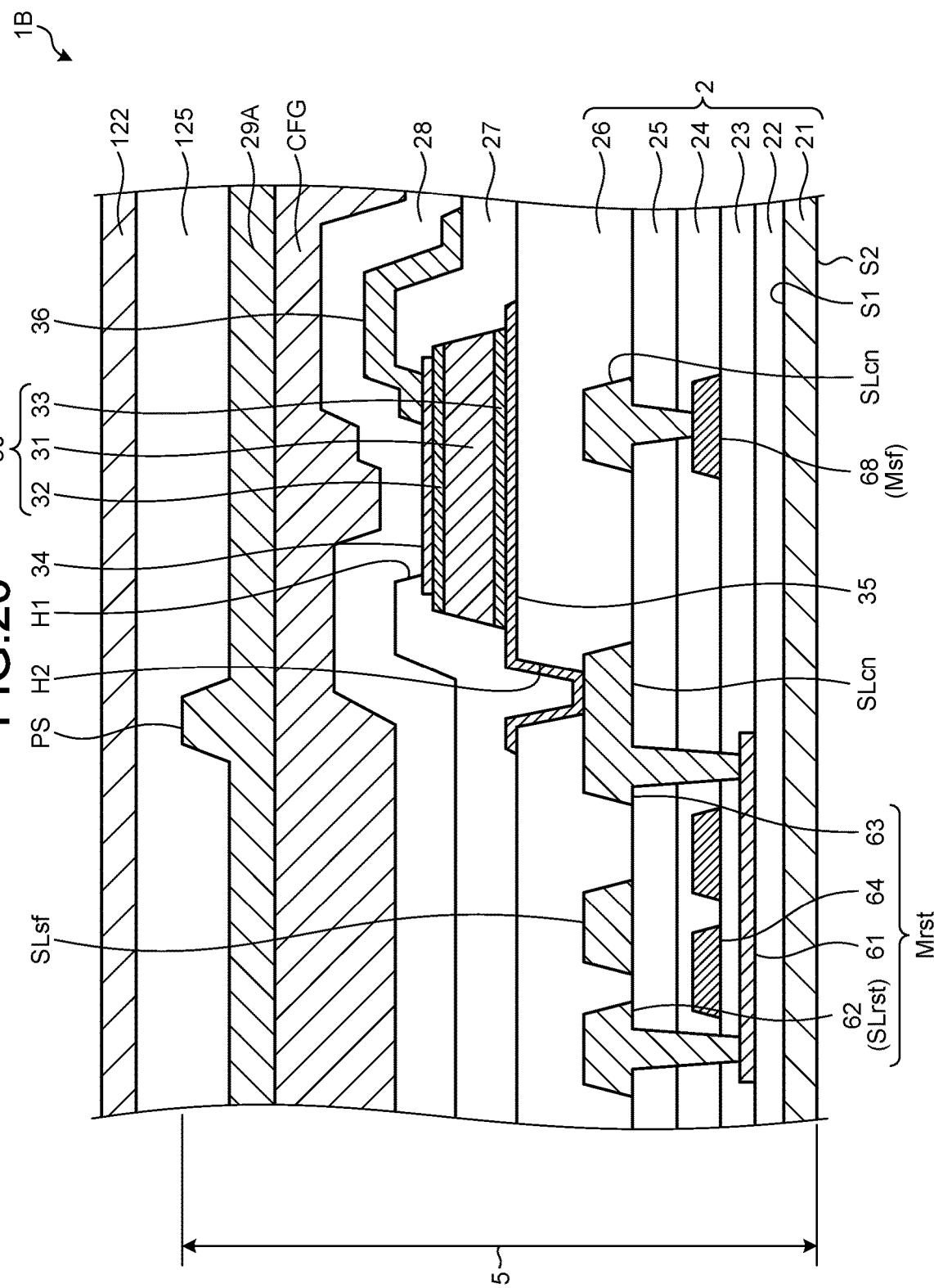
FIG. 20 is a sectional view illustrating a detection device according to a third embodiment of the present invention.

FIG. 20 is a sectional view illustrating a detection device according to a third embodiment of the present invention. A detection device 1B according to the third embodiment differs in configuration from the detection device according to the first embodiment described above in including a color filter CFG above the photoelectric conversion element 30 serving as the sensor element.

Specifically, as illustrated in FIG. 20, the color filter CFG is provided above the insulating film 28 so as to cover the photoelectric conversion element 30. The color filter CFG is formed of a colored resin material, such as a resist resin. The color filter CFG has a property of transmitting light in the visible light region, and not transmitting light in the infrared region. More preferably, the color filter CFG can transmit light in a wavelength region of green, for example, from 460 nm to 570 nm.

An insulating film 29A is provided above the color filter CFG, and the first projection PS is provided on a surface of the insulating film 29A. The insulating film 29A and the first projection PS are an organic insulating film, and are made using, for example, a thermosetting organic material. The first projection PS can be formed, for example, by applying a half-exposure process to the surface of the insulating film 29A. As described above, in the detection device 1B of the third embodiment, the insulating film 27, the insulating film 28, the color filter CFG, the insulating film 29A, the first projection PS, the adhesive layer 125, and the cover member 122 are stacked in this order above the photoelectric conversion element 30.

Since the detection device 1B of the third embodiment includes the color filter CFG, the photoelectric conversion element 30 can receive light in a specific wavelength region. In other words, wavelength components not used for detecting the biological information (for example, components in the infrared region) are cut off from the light incident on the photoelectric conversion element 30. Therefore, the detection device 1B can reduce false detections.

In the present embodiment, the insulating film 29A and the color filter CFG provided above the photoelectric conversion element 30 serve as protective films for the photoelectric conversion element 30 and the array substrate 2. The present invention is not limited to this configuration. Instead of the insulating film 29A, the insulating film 29 serving as a hard coat film may be provided above the color filter CFG in the same manner as in the first embodiment. The transmission characteristics of the color filter CFG can be changed according to the detection target and the characteristics of the photoelectric conversion element 30 so as to allow the photoelectric conversion element 30 to receive light having an appropriate wavelength component.

Fifth Modification

Figure 21:
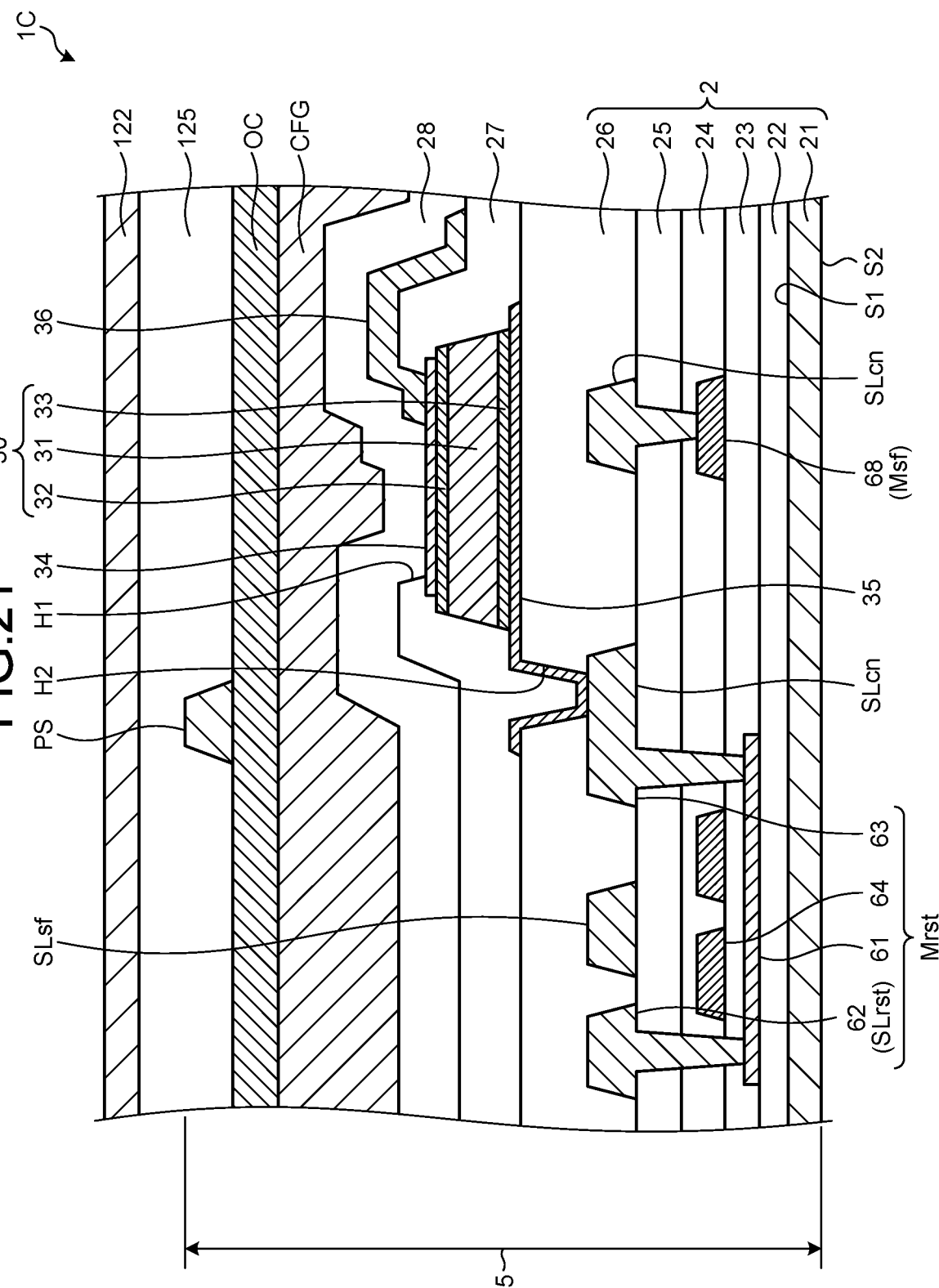
FIG. 21 is a sectional view illustrating a detection device according to a fifth modification of the third embodiment.

FIG. 21 is a sectional view illustrating a detection device according to a fifth modification of the third embodiment. As illustrated in FIG. 21, in a detection device 1C of the fifth modification, an overcoat film OC is provided above the color filter CFG, and the first projection PS is provided above the overcoat film OC. Different resin materials are used as the overcoat film OC and the first projection PS. For example, the overcoat film OC is made of an ultraviolet-curable organic resin material, and the first projection PS is made of a thermosetting organic resin material.

As described above, in the detection device 1C of the fifth modification, the insulating film 27, the insulating film 28, the color filter CFG, the overcoat film OC, the first projection PS, the adhesive layer 125, and the cover member 122 are stacked in this order above the photoelectric conversion element 30. Also, in the fifth modification, the overcoat film OC and the color filter CFG provided above the photoelectric conversion element 30 serve as protective films for the photoelectric conversion element 30 and the array substrate 2.

Sixth Modification

Figure 22:
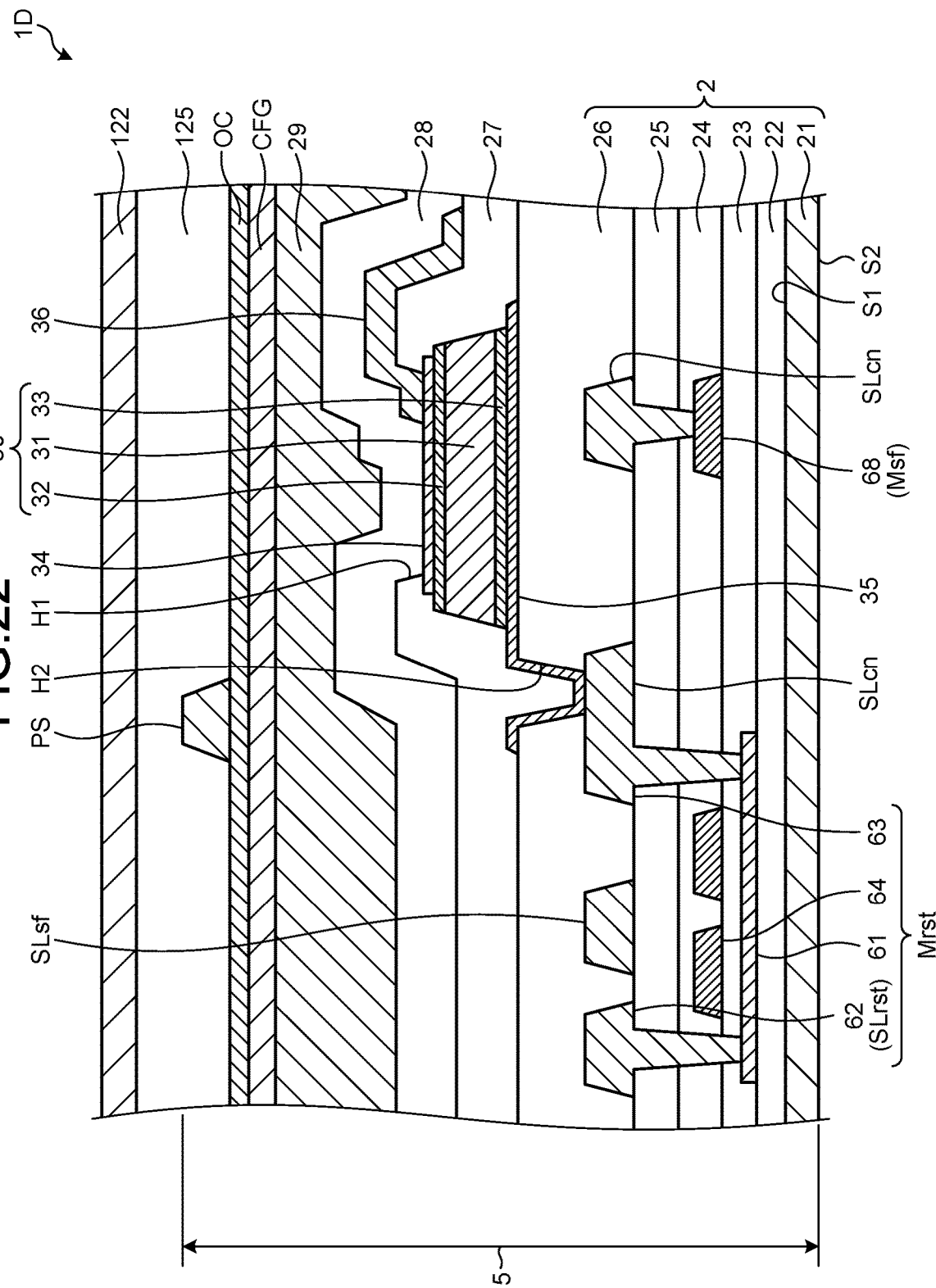
FIG. 22 is a sectional view illustrating a detection device according to a sixth modification of the third embodiment.

FIG. 22 is a sectional view illustrating a detection device according to a sixth modification of the third embodiment. As illustrated in FIG. 22, a detection device 1D of the sixth modification differs in configuration from the detection device according to the fifth modification described above in that the insulating film 29 is provided between the insulating film 28 and the color filter CFG. The insulating film 29 is a hard coat film similar to that of the first embodiment.

In the present modification, the color filter CFG is provided on a flatly formed surface of the insulating film 29. In the detection device 1D of the sixth modification, the insulating film 27, the insulating film 28, the insulating film 29, the color filter CFG, the overcoat film OC, the first projection PS, the adhesive layer 125, and the cover member 122 are stacked in this order above the photoelectric conversion element 30. In the sixth modification, compared with the fifth modification, the insulating film 29 is added as a protective film for the photoelectric conversion element 30. Therefore, the function of protecting the photoelectric conversion element 30 is improved.

Seventh Modification

Figure 23:
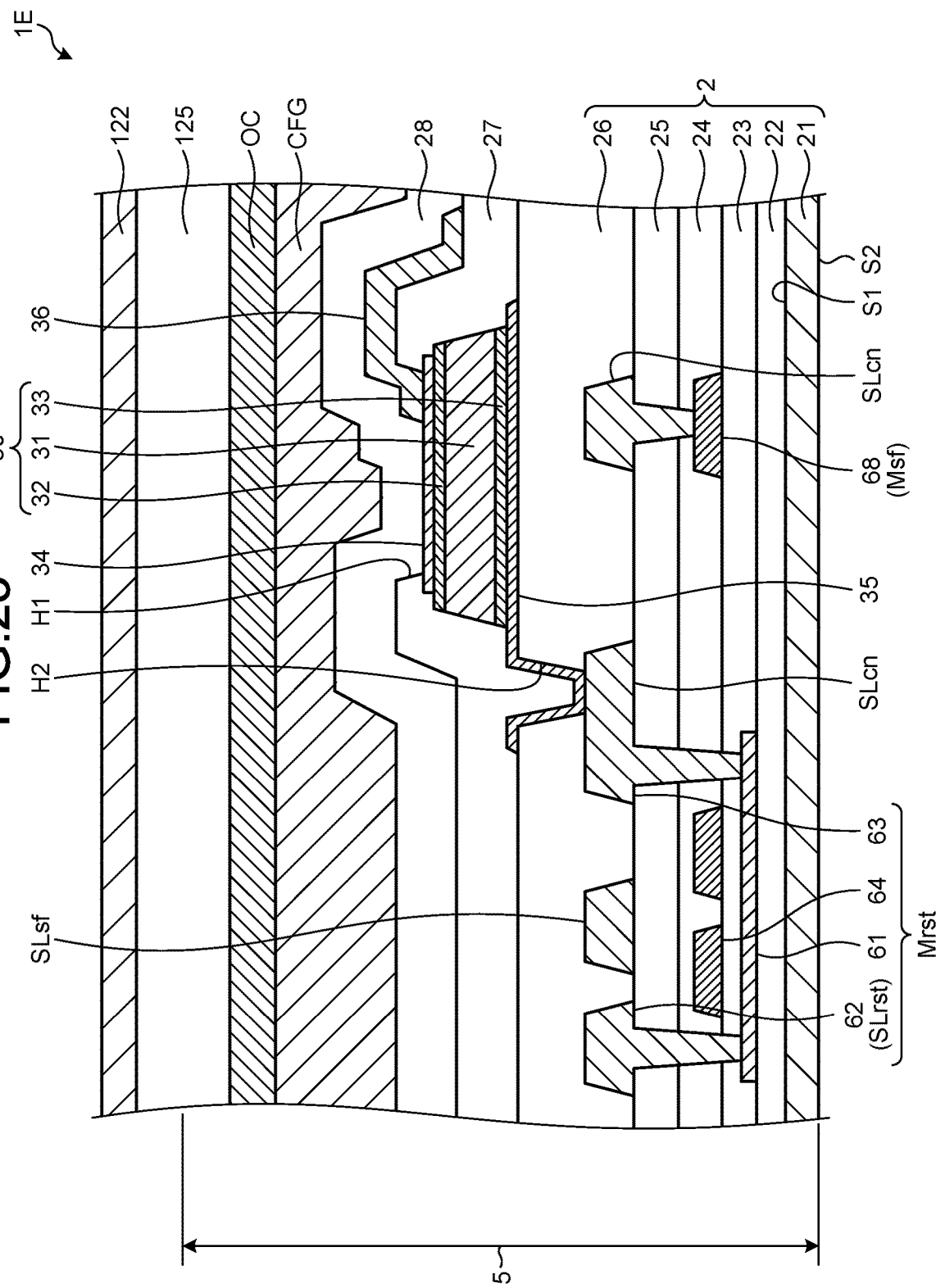
FIG. 23 is a sectional view illustrating a detection device according to a seventh modification of the third embodiment.

FIG. 23 is a sectional view illustrating a detection device according to a seventh modification of the third embodiment. As illustrated in FIG. 23, a detection device 1E of the seventh modification differs in configuration from the detection device according to the sixth modification described above in that the insulating film 29 and the first projection PS are not provided.

That is, the overcoat film OC has a flat surface on which no structure is formed. In the detection device 1E of the seventh modification, the insulating film 27, the insulating film 28, the color filter CFG, the overcoat film OC, the adhesive layer 125, and the cover member 122 are stacked in this order above the photoelectric conversion element 30. Thus, the color filter CFG can be applied to the configuration in which the first projection PS is not provided.

Eighth Modification

Figure 24:
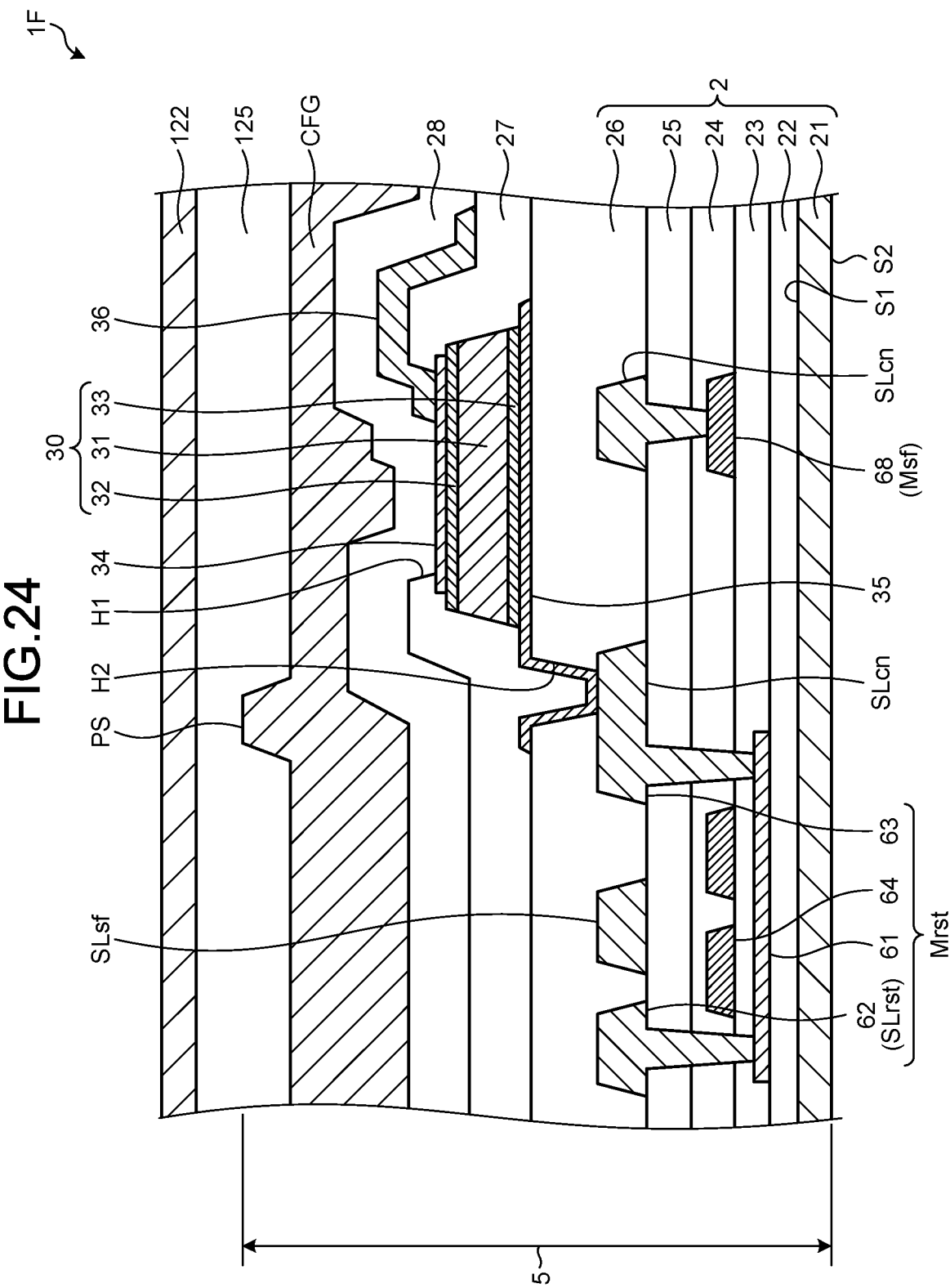
FIG. 24 is a sectional view illustrating a detection device according to an eighth modification of the third embodiment.

FIG. 24 is a sectional view illustrating a detection device according to an eighth modification of the third embodiment. As illustrated in FIG. 24, a detection device 1F of the eighth modification differs in configuration from the detection devices according to the third embodiment and the fifth to the seventh modifications described above in that the insulating film 29, the insulating film 29A, and the overcoat film OC are not provided. That is, in the eighth modification, the color filter CFG also serves as a protective film for the photoelectric conversion element 30.

The color filter CFG is provided above the insulating film 28. The first projection PS is provided on a surface of the color filter CFG. That is, in the detection device 1F of the eighth modification, the insulating film 27, the insulating film 28, the color filter CFG, the first projection PS, the adhesive layer 125, and the cover member 122 are stacked in this order above the photoelectric conversion element 30. The first projection PS is made of the same material as that of the color filter CFG, and is integrally formed with the color filter CFG. The first projection PS is formed, for example, by patterning the color filter CFG, for example, using the half-exposure process. In the eighth modification, the number of layers of the sensor substrate 5 can be made smaller than that in the third embodiment and the fifth to the seventh modifications.

Ninth Modification

FIG. 25 is a sectional view illustrating a detection device according to a ninth modification of the third embodiment. As illustrated in FIG. 25, a detection device 1G of the ninth modification differs in configuration from the detection device according to the eighth modification described above in that the first projection PS is formed of a material different from that of the color filter CFG. The first projection PS is formed of, for example, a thermosetting organic resin material.

As described above, the combination of the color filter CFG with the layers of the various insulating films can be changed as appropriate. The configurations of the third embodiment and the fifth to the ninth modifications can be combined with those of the first embodiment and the first to the fourth modifications described above.

While the preferred embodiments of the present invention have been described above, the present invention is not limited to the embodiments described above. The content disclosed in the embodiments is merely an example, and can be variously modified within the scope not departing from the gist of the present invention. Any modifications appropriately made within the scope not departing from the gist of the present invention also naturally belong to the technical scope of the present invention.

What is claimed is:

1. A method for manufacturing a detection device, the detection device comprising a substrate, a plurality of sensor elements arranged on a first principal surface of the substrate, and an insulating film provided above the substrate so as to cover the sensor elements, and the method comprising:

causing the first principal surfaces of a pair of the substrates on each of which the sensor elements, the insulating film, and a first projection projecting from a surface of the insulating film are formed to face each other, and bonding together the pair of the substrates; and polishing a second principal surface of each of the pair of the substrates on a side opposite to the first principal surface in a state where the pair of the substrates are bonded together.

2. The method according to claim 1, wherein, in the state where the pair of the substrates are bonded together, at least a portion of the first projection provided on one of the substrates is provided so as to overlap the first projection provided on another of the substrates in a plan view from a direction orthogonal to the substrate.

3. The method according to claim 1, wherein, in the state where the pair of the substrates are bonded together, a longitudinal direction of the first projection provided on one of the substrates intersects the longitudinal direction of the first projection provided on another of the substrates in a plan view from a direction orthogonal to the substrate.

4. The method according to claim 1, wherein, in the state where the pair of the substrates are bonded together, the first projection provided on one of the substrates is provided in a position not overlapping the first projection provided on another of the substrates in a plan view from a direction orthogonal to the substrate.

5. The method according to claim 4, wherein, in the state where the pair of the substrates are bonded together, the first projections provided on the one of the substrates and the first projections provided on the other of the substrates are alternately arranged.

6. The method according to claim 1, wherein the detection device further comprises an annular second projection and a third projection that has an outside diameter smaller than an inside diameter of the second projection in a plan view from a direction orthogonal to the substrate, and in the state where the pair of the substrates are bonded together, the second projection provided on one of the substrates engages with the third projection provided on another of the substrates.

7. The method according to claim 1, further comprising separating the pair of the substrates, and then dividing each of the pair of the substrates into dice planned to form the detection devices.

8. The method according to claim 1, further comprising:

dividing the pair of the substrates in the state of being bonded together into layered pairs of dice planned to form the detection devices; and separating each of the layered pairs of dice into each die.

9. The method according to claim 1, wherein the insulating film and the first projection are formed of an organic material.

* * * * *